US010878925B1

(12) United States Patent
Vishwanath et al.

(10) Patent No.: US 10,878,925 B1
(45) Date of Patent: Dec. 29, 2020

(54) DYNAMIC READ VOLTAGES IN NON-VOLATILE MEMORY

(71) Applicant: SanDisk Technologies LLC, Addison, TX (US)

(72) Inventors: Shreejith Koruvailu Vishwanath, Bangalore (IN); Bhavadip Bipinbhai Solanki, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/912,425

(22) Filed: Jun. 25, 2020

Related U.S. Application Data

(63) Continuation of application No. 16/440,534, filed on Jun. 13, 2019.

(51) Int. Cl.

| | | |
|---|---|---|
| *G11C 11/419* | (2006.01) | |
| *G11C 16/26* | (2006.01) | |
| *G11C 16/04* | (2006.01) | |
| *G06F 11/10* | (2006.01) | |
| *G11C 16/10* | (2006.01) | |
| *G11C 29/52* | (2006.01) | |
| *H01L 27/11582* | (2017.01) | |
| *H01L 27/11565* | (2017.01) | |

(52) U.S. Cl.
CPC .......... *G11C 16/26* (2013.01); *G06F 11/1068* (2013.01); *G11C 16/0483* (2013.01); *G11C 16/10* (2013.01); *G11C 29/52* (2013.01); *H01L 27/11565* (2013.01); *H01L 27/11582* (2013.01)

(58) Field of Classification Search
CPC ....................................... G11C 7/227

USPC .................................................. 365/189.15
See application file for complete search history.

(56) References Cited

U.S. PATENT DOCUMENTS

| | | | |
|---|---|---|---|
| 7,876,621 | B2 | 1/2011 | Sharon et al. |
| 8,154,921 | B2 | 4/2012 | Mokhlesi et al. |
| 8,406,053 | B1 | 3/2013 | Dutta et al. |
| 9,036,417 | B2 | 5/2015 | Chen et al. |
| 9,472,298 | B1 | 10/2016 | Louie et al. |

(Continued)

OTHER PUBLICATIONS

Response to Restriction Requirement dated Jul. 9, 2020, U.S. Appl. No. 16/440,534, filed Jun. 13, 2019.

(Continued)

*Primary Examiner* — Jason Lappas
(74) *Attorney, Agent, or Firm* — Vierra Magen Marcus LLP

(57) ABSTRACT

A non-volatile storage system comprises a group of non-volatile memory cells, and one or more control circuits in communication with the group. The one or more control circuits are configured to perform a plurality of passes to revise a read reference signal based on comparisons of numbers of non-volatile memory cells in the group having a value for a physical property (e.g., threshold voltage or resistance) in adjacent regions. With each pass the adjacent regions are smaller. The one or more control circuits are configured to establish a final read reference signal based on a signal associated with one of the adjacent regions on a final pass of the plurality of passes. The one or more control circuits are configured to use the final read reference signal to distinguish between two adjacent data states stored in the group.

20 Claims, 17 Drawing Sheets

(56) References Cited

U.S. PATENT DOCUMENTS 9,570,185 B2  2/2017 Mokhlesi
2014/0247675 A1* 9/2014 Tao .................. G11C 7/227
                                              365/189.15

OTHER PUBLICATIONS

U.S. Appl. No. 16/440,534, filed Jun. 13, 2019.
Restriction Requirement dated Jun. 9, 2020, U.S. Appl. No. 16/440,534, filed Jun. 13, 2019.
Notice of Allowance dated Sep. 2, 2020, U.S. Appl. No. 16/440,534, filed Jun. 13, 2019.

* cited by examiner

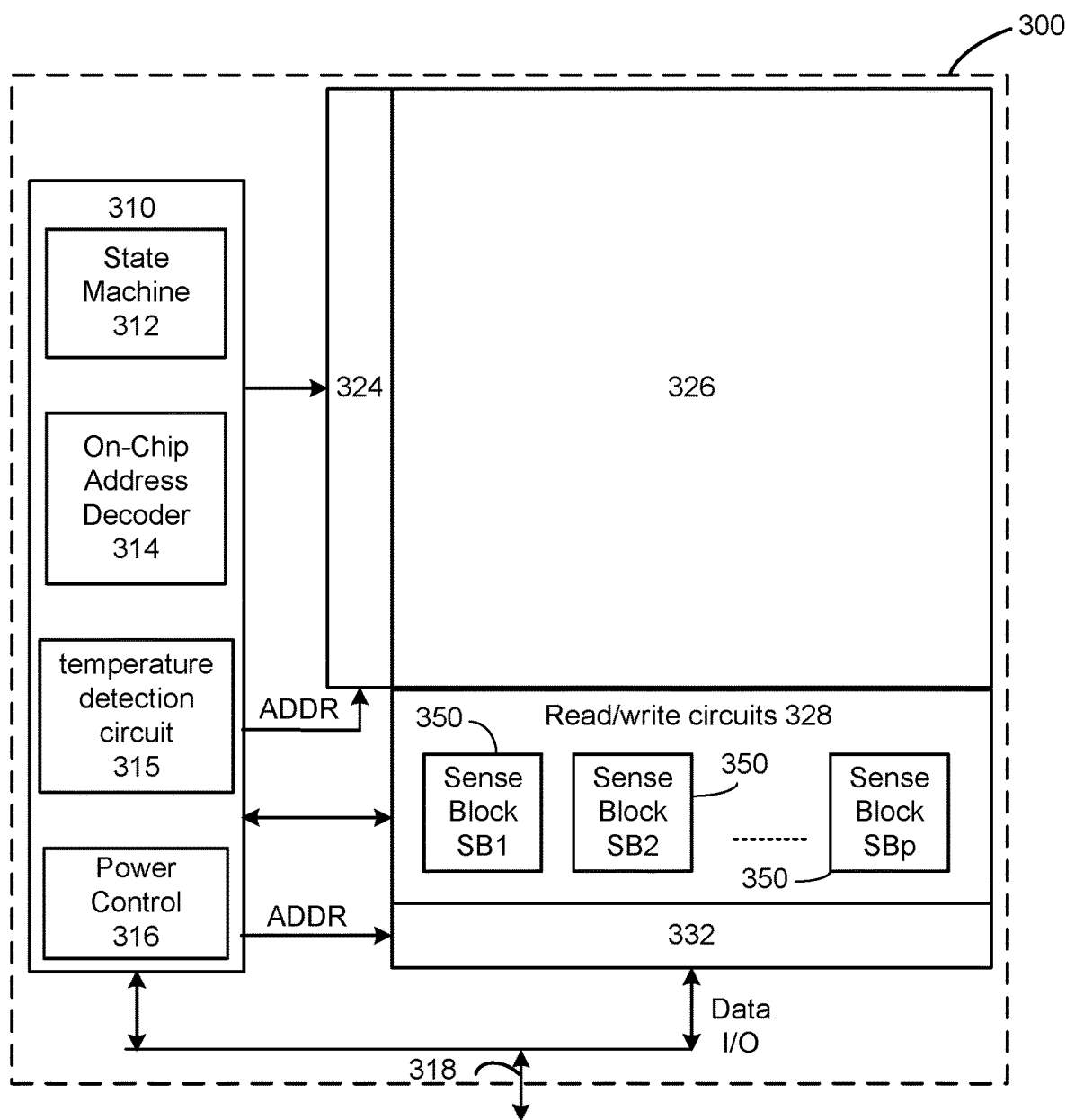

US 10,878,925 B1

DYNAMIC READ VOLTAGES IN NON-VOLATILE MEMORY

CLAIM OF PRIORITY

This application is a continuation application of U.S. patent application Ser. No. 16/440,534, entitled "DYNAMIC READ VOLTAGES IN NON-VOLATILE MEMORY," filed Jun. 13, 2019 and incorporated herein by reference in its entirety.

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. Some memory cells store information by storing a charge in a charge storage region. Other memory cells store information using other techniques, such as by the resistance of the memory cell.

When a memory system is deployed in or connected to an electronic device (the host), the memory system can be used to store data and read data. It is important that writing and reading is performed accurately, so that data is not lost. Over time the integrity of the stored data may suffer due to effects such as read disturb and data retention issues. Read disturb is a phenomenon in which reading memory cells disturbs the data stored in either the read data cells or other data cells not presently being read but typically near the cells being read. Data retention refers to the ability of a memory cell to retain its data state over time. A memory cell may lose its charge or have its resistance change over time even if there is not read disturb. Issues such as read disturb and data retention can cause what is referred to as a failed bit. A failed bit means that a value of a bit that is read is flipped from the value that was stored in the memory cell. The memory system is able to correct for some of the failed bits by use of an error correction algorithm, which is used to decode the data.

BRIEF DESCRIPTION OF THE DRAWINGS

Like-numbered elements refer to common components in the different Figures.

FIG. 2 is a block diagram of one embodiment of a memory die.

DETAILED DESCRIPTION

Techniques are disclosed herein to dynamically determine new read reference voltages for non-volatile memory. In some embodiments, at least two passes are made to revise a read reference signal to distinguish between two adjacent data states. Each pass involves a comparison of the number of memory cells having a value for a physical property (e.g., threshold voltage, resistance, conductance) in adjacent regions, in an embodiment. With each pass, the size of the regions used for the comparison of the number of memory cells is decreased, which more precisely determines the read reference signal. If the size of the regions used in the first pass is too small, then the process could take too long to find the new read reference signal. Also, if the size of the regions used in the first pass is too small, then the comparison of the numbers of memory cells in adjacent regions could be inaccurate due to irregularities in, for example, threshold voltage distributions. In some embodiments, data from sensing the memory cells in one pass is used to revise the read reference signal in a later pass, which reduces the number of sensing operations. Therefore, the read reference signal is quickly revised.

Figure 1A:
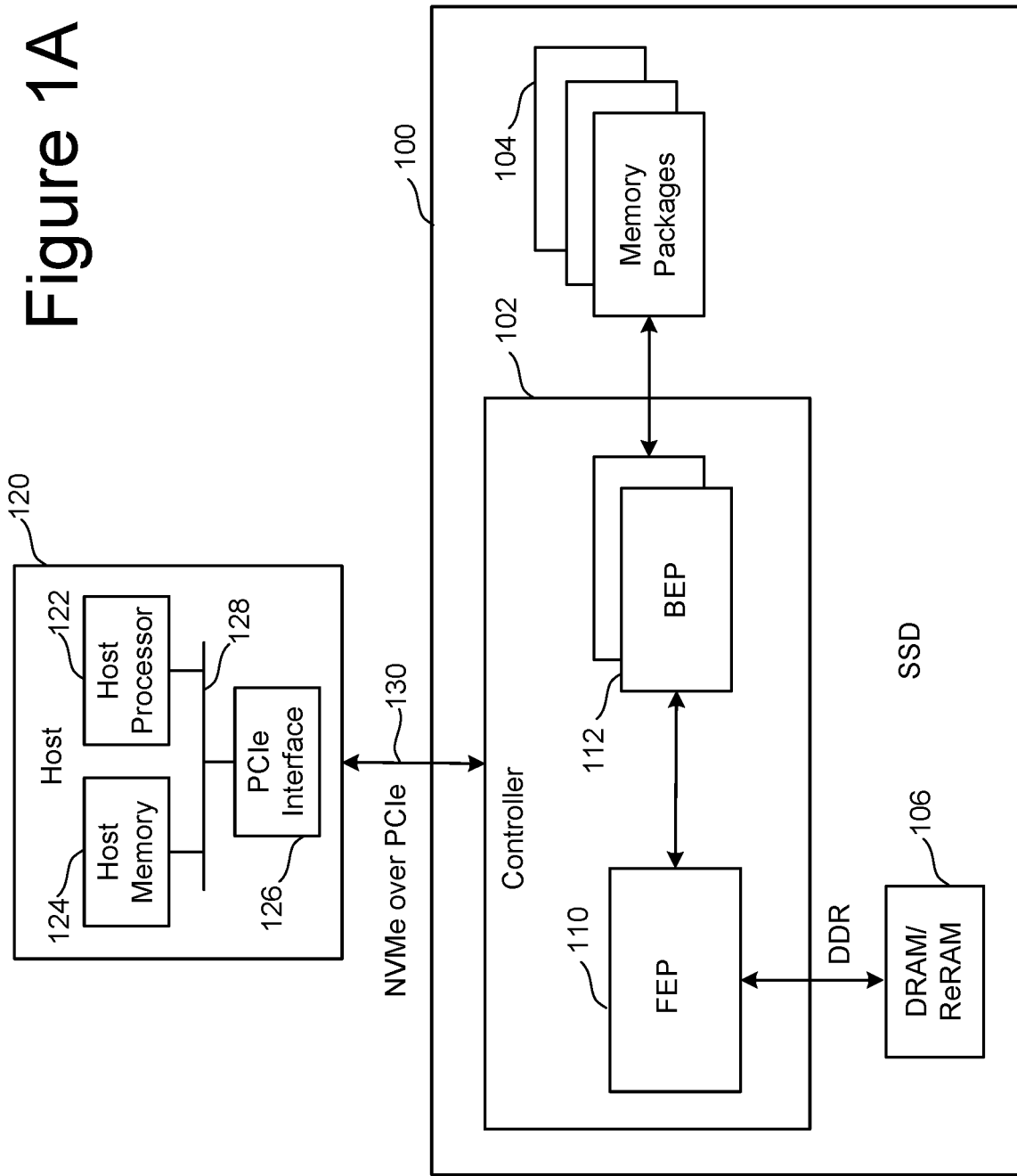
FIG. 1A is a block diagram of one embodiment of a memory system connected to a host.

FIG. 1A is a block diagram of one embodiment of a memory system 100 connected to a host 120. Memory system 100 can implement the technology proposed herein. Many different types of memory systems can be used with the technology proposed herein. One example memory system is a solid state drive ("SSD"); however, other types of memory systems can also be used. Memory system 100 comprises a Controller 102, non-volatile memory 104 for storing data, and local memory (e.g. DRAM/ReRAM) 106. Controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 14 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected to bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 1B:
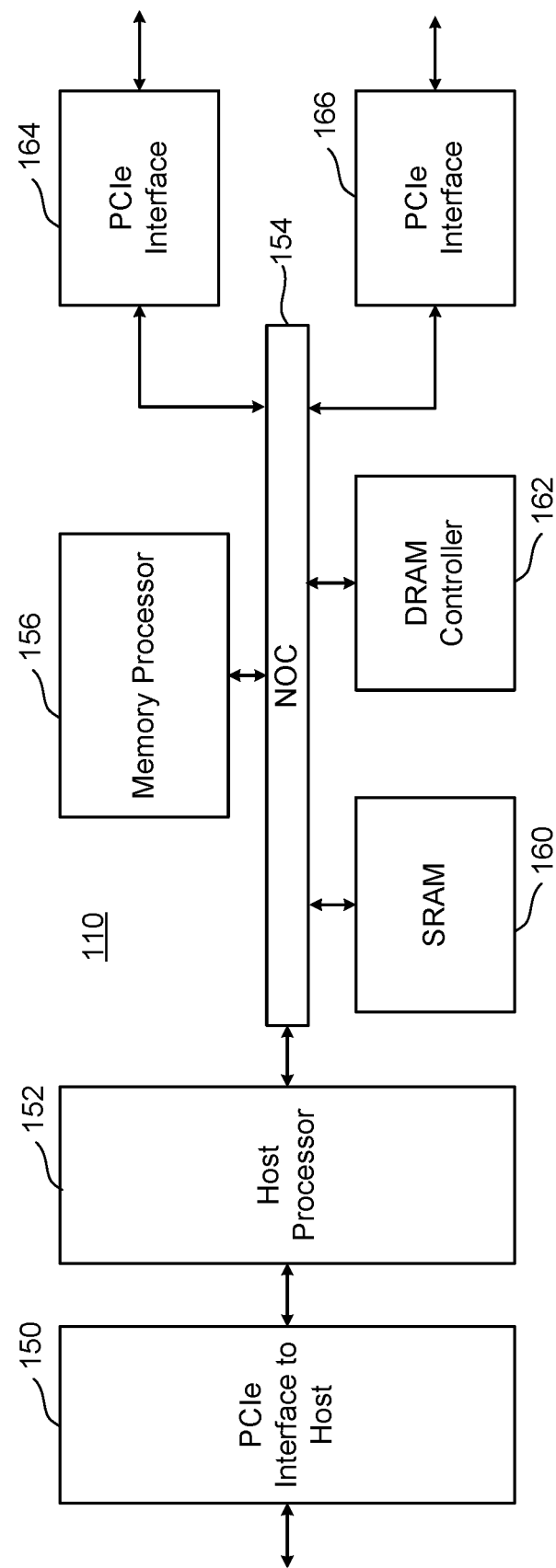
FIG. 1B is a block diagram of one embodiment of a Front End Processor Circuit. In some embodiments, the Front End Processor Circuit is part of a Controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 1C:
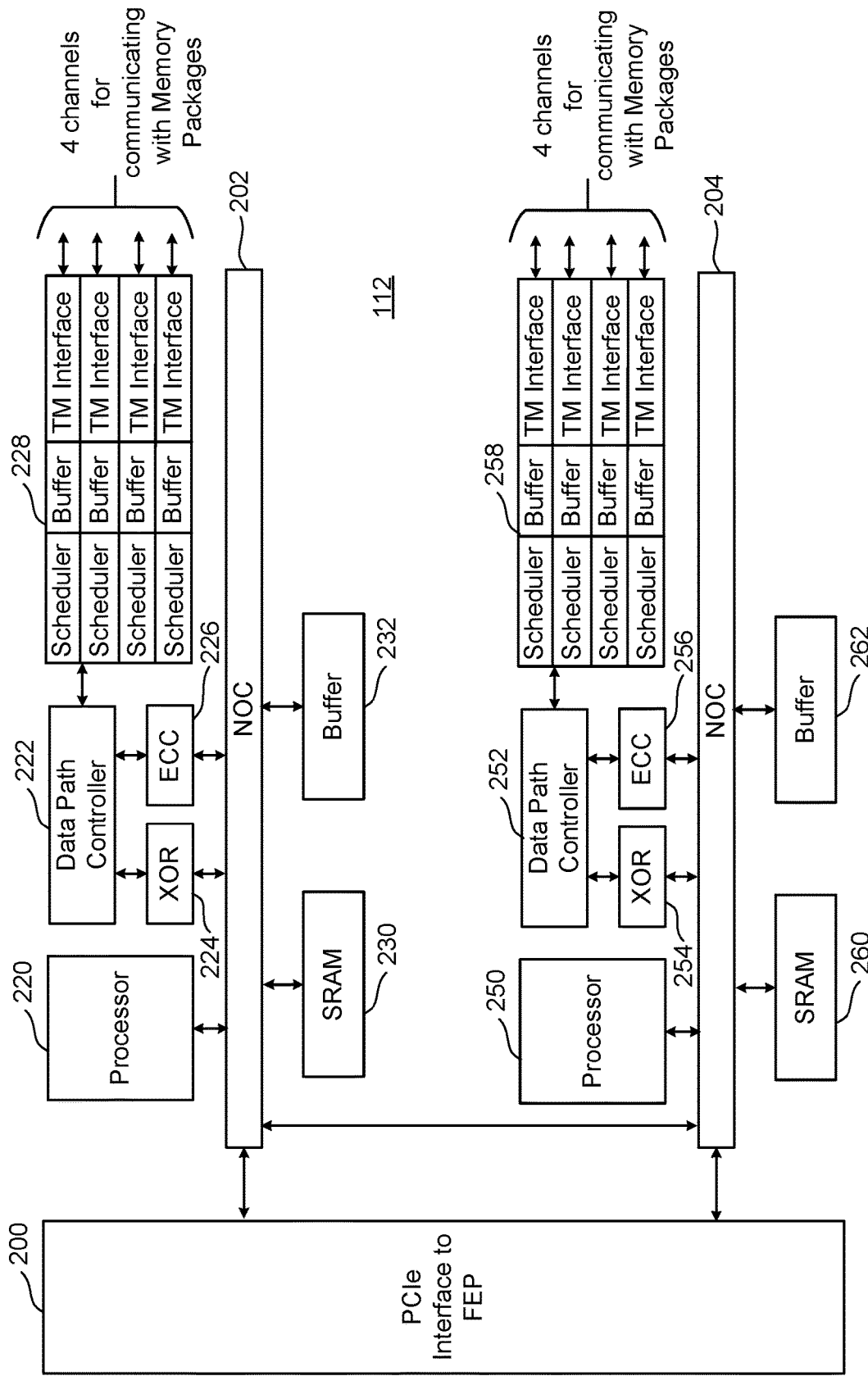
FIG. 1C is a block diagram of one embodiment of a Back End Processor Circuit. In some embodiments, the Back End Processor Circuit is part of a Controller.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
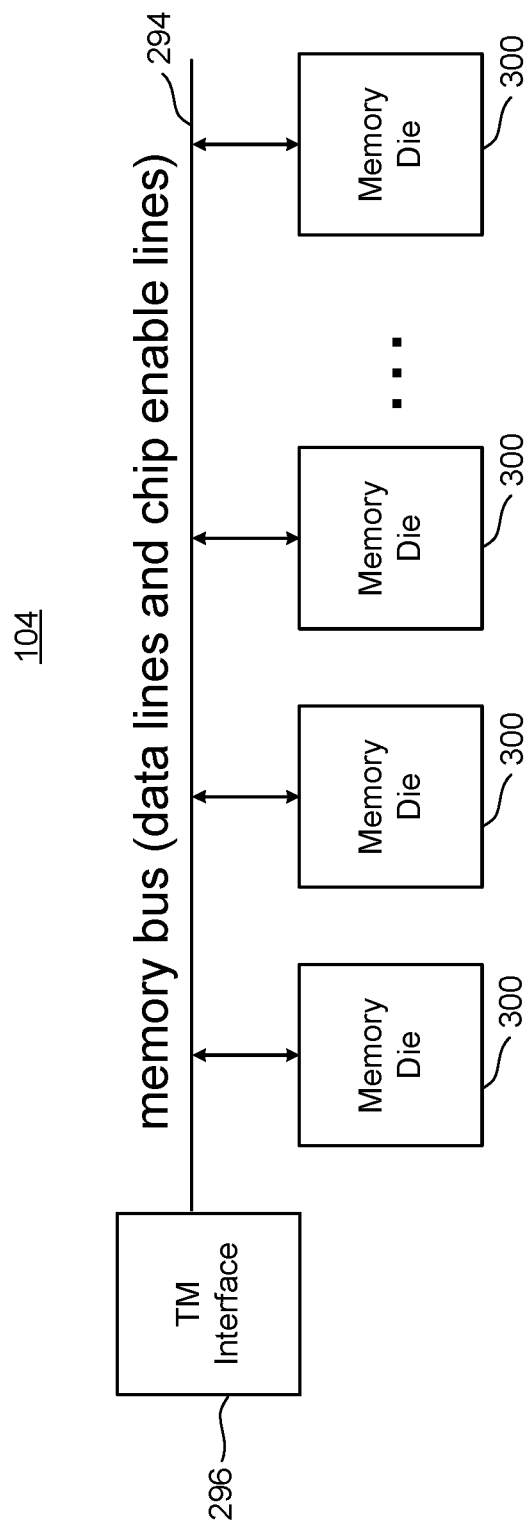
FIG. 1D is a block diagram of one embodiment of a memory package.

FIG. 1D is a block diagram of one embodiment of a memory package 104 that includes a plurality of memory die 300 connected to a memory bus (data lines and chip enable lines) 294. The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

FIG. 2 is a functional block diagram of one embodiment of a memory die 300. Each of the one or more memory die 300 of FIG. 1D can be implemented as memory die 300 of FIG. 2. The components depicted in FIG. 2 are electrical circuits. In one embodiment, each memory die 300 includes a memory structure 326, control circuitry 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature detection circuit 315. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise one or more control circuits for memory structure 326. These one or more control circuits are electrical circuits that perform the functions described below in the flow charts and signal diagrams. In other embodiments, the one or more control circuits can consist only of controller 102, which is an electrical circuit in combination with software, that performs the functions described below in the flow charts and signal diagrams. In another alternative, the one or more control circuits comprise controller 102 and control circuitry 310 performing the functions described below in the flow charts and signal diagrams. In another embodiment, the one or more control circuits comprise state machine 312 (or a microcontroller or microprocessor) alone or in combination with controller 102.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721, 662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
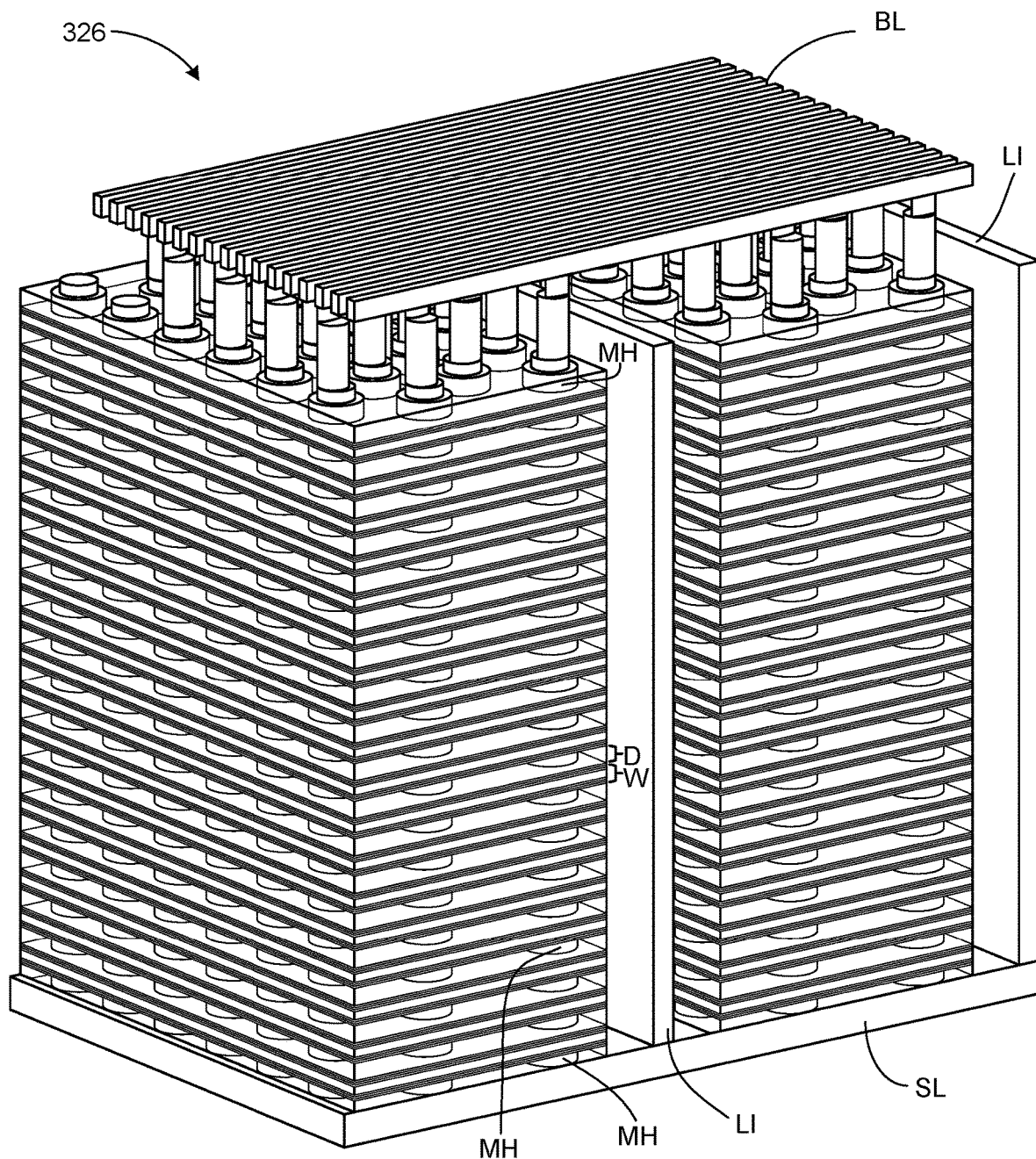
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-278 alternating dielectric layers and conductive layers, for example, 127 data word line layers, 8 select layers, 4 dummy word line layers and 139 dielectric layers.

More or fewer than 108-278 layers can also be used. As will be explained below, the alternating dielectric layers and conductive layers are divided into four "fingers" by local interconnects LI. FIG. 3 shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory array that comprises memory structure 326 is provided below with respect to FIG. 4A-4C.

Figure 4A:
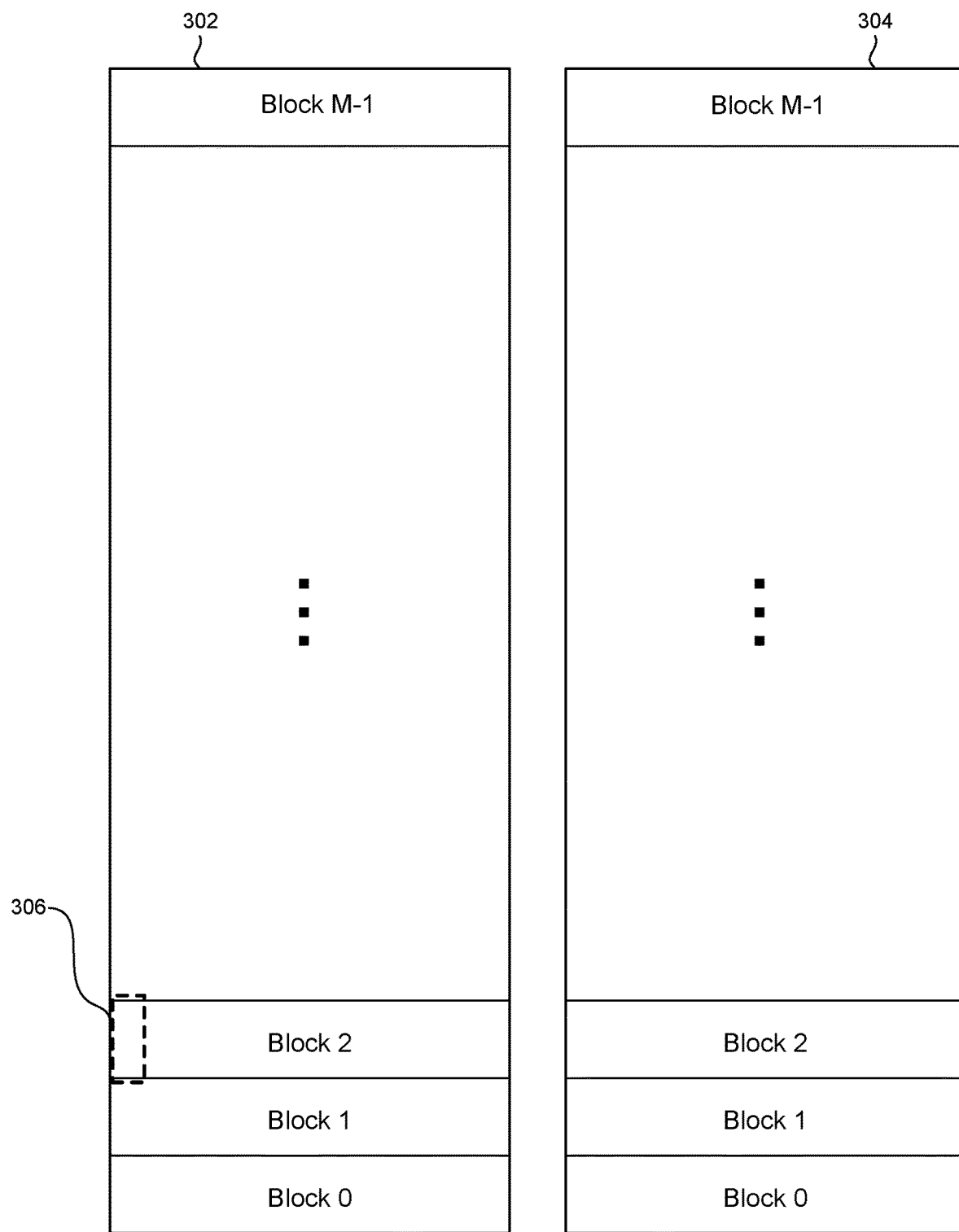
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In some embodiments, a block represents a groups of connected memory cells as the memory cells of a block share a common set of word lines.

Figure 4B:
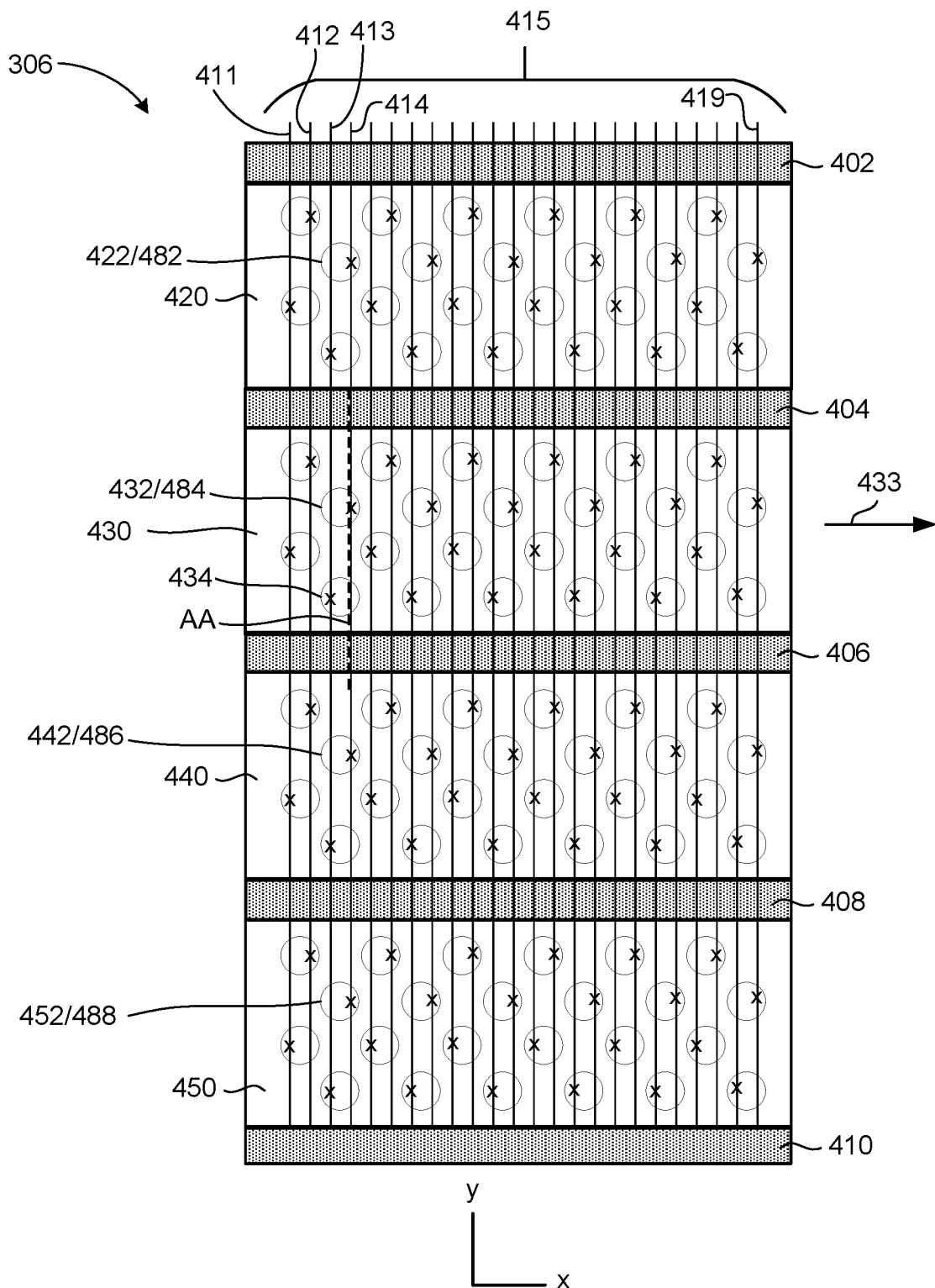
FIG. 4B depicts a top view of a portion of a block of memory cells.
Figure 4C:
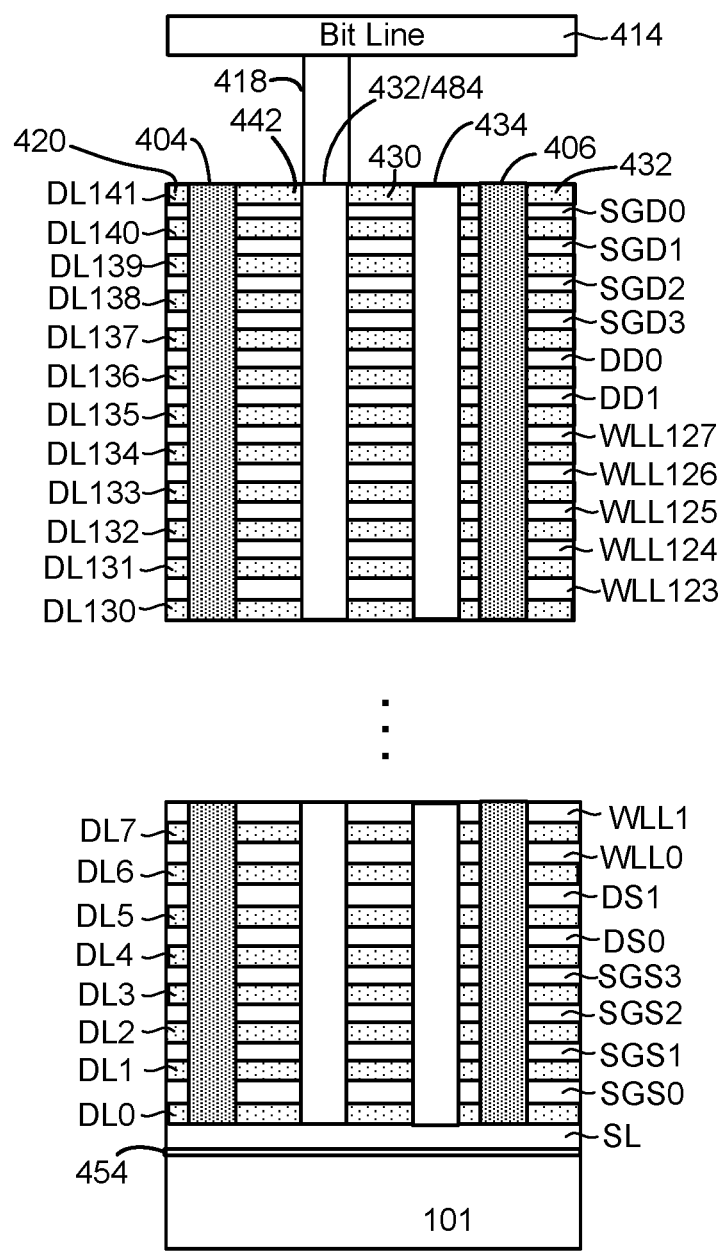
FIG. 4C depicts a cross sectional view of a portion of a block of memory cells.

FIGS. 4B-4C depict an example three dimensional ("3D") NAND structure. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 433. In one embodiment, the memory array has sixty layers. Other embodiments have less than or more than sixty layers. However, FIG. 4B only shows the top layer.

FIG. 4B depicts a plurality of circles that represent the vertical columns. Each of the vertical columns include multiple select gates (also referred to as a select transistors) and multiple memory cells (also referred to as data memory cells). In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 433, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines may be connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3 associated with the drain side select gates; four source side select layers SGS0, SGS1, SGS2 and SGS3 associated with the source side select gates; four dummy word line layers DD0, DD1, DS0 and DS1; and forty eight data word line layers WLL0-WLL127 for connecting to data memory cells. Other embodiments can implement more or less than four drain side select layers, more or less than four source side select layers, more or less than four dummy word line layers, and more or less than one hundred and twenty eight word line. Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 418. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL127 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL141. For example, dielectric layers DL131 is above word line layer WLL123 and below word line layer WLL124. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL127 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Although the example memory system of FIGS. 3-4C is a three dimensional memory structure that includes vertical NAND strings with charge-trapping material, other (2D and 3D) memory structures can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

Figure 5:
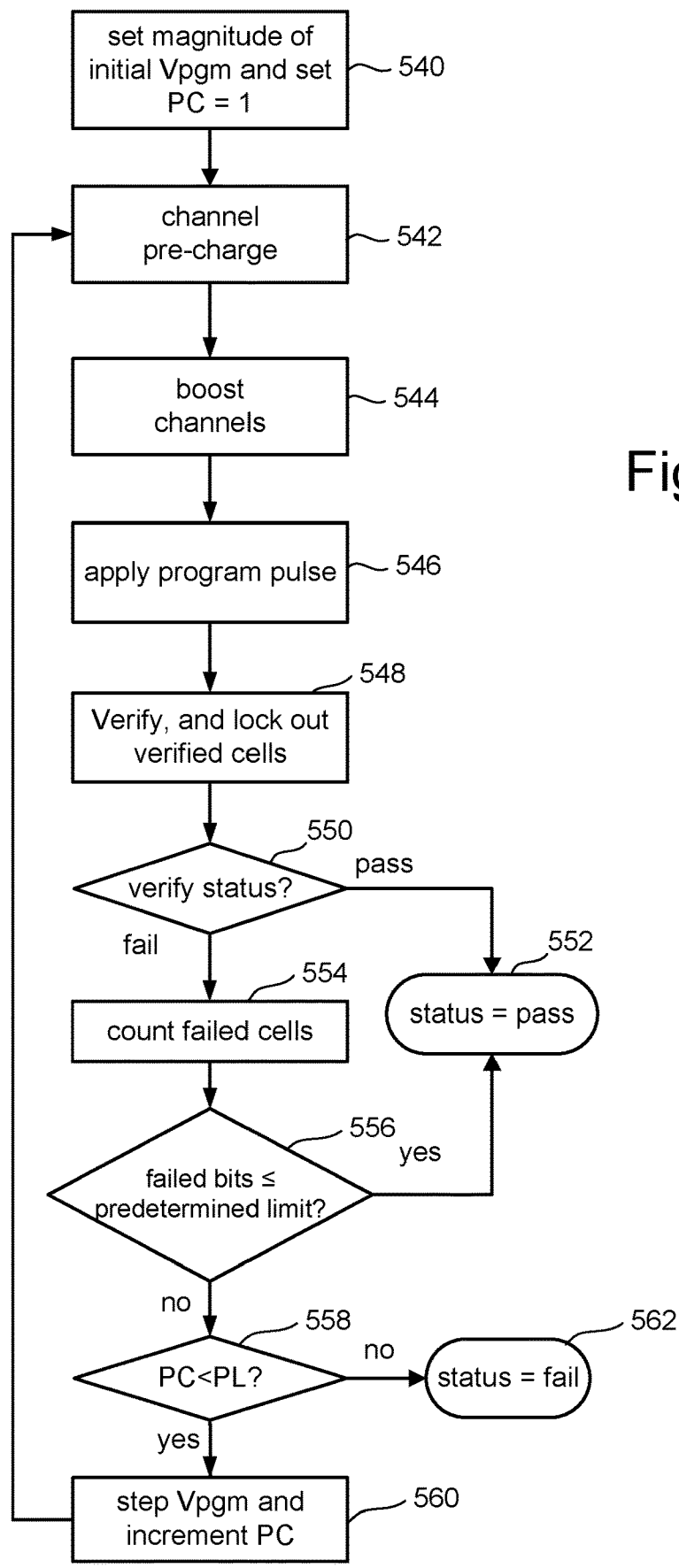
FIG. 5 is a flow chart describing one embodiment of a process for programming.

FIG. 5 is a flow chart describing one embodiment of a process for programming. In some embodiments, data is programmed (written) in pages and read in pages. In one embodiment, a page includes all data stored in memory cells connected to a common word line. In one embodiment, a page includes one bit of data stored in each memory cell connected to a common word line. In one embodiment, a page includes all data stored in a subset of memory cells connected to a common word line. In one embodiment, a page includes all (or one bit of) data stored in memory cells of the same sub-block connected to a common word line. In one example embodiment, the process of FIG. 5 is performed on memory die 300 using the control circuit discussed above. For example, the process of FIG. 5 can be performed at the direction of state machine 312.

Typically, the program voltage applied to the control gates (via a selected word line) during a program operation is applied as a series of program pulses. Between at least some of the programming pulses are a set of verify pulses to perform verification. In many implementations, the magnitude of the program pulses is increased with each successive pulse by a predetermined step size. In step 540 of FIG. 5, the programming voltage (Vpgm) is initialized to the starting magnitude (e.g., ~12-16V or another suitable level) and a program counter PC maintained by state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with state S0 so they will not be programmed. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 542 the memory system will pre-charge channels of NAND strings that include memory cells connected to the selected word line that are to be inhibited from programming. In some embodiments, the channel is pre-charged from the drain end of the NAND string. By "drain end" it is meant the end of the NAND string connected to the bit line. In some embodiments, the channel is pre-charged from the source end. By "source end" it is meant the end of the NAND string connected to the source line. In some embodiments, the channel is pre-charged from both the drain end and the source end.

In step 544, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~5-11 volts) to perform boosting schemes. A program inhibit voltage is applied to the bit lines coupled the unselected NAND string. This allows the boosting voltages to boost the potential of the NAND channel.

In step 546, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string." In step 546, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 548, memory cells that have reached their target states are locked out from further programming. Step 548 may include performing verifying at one or more verify reference levels. In one embodiment, the verification process is performed by testing whether the threshold voltages of the memory cells selected for programming have reached the appropriate verify reference voltage. The verify reference voltage is at a lower tail of the target state, in one embodiment. As used herein "lower tail" refers to a portion of distribution between its lowest threshold voltage level and the threshold voltage level at the apex of the distribution. Similarly, as used herein "upper tail" refers to a portion of distribution between its highest threshold voltage level and the threshold voltage level at the apex of the distribution.

In step 548, a memory cell may be locked out after the memory cell has been verified (by a test of the Vt) that the memory cell has reached its target state.

If, in step 550, it is determined that all of the memory cells have reached their target threshold voltages (pass), the programming process is complete and successful because all selected memory cells were programmed and verified to their target states. A status of "PASS" is reported in step 552. Otherwise if, in 550, it is determined that not all of the memory cells have reached their target threshold voltages (fail), then the programming process continues to step 554.

In step 554, the memory system counts the number of memory cells that have not yet reached their respective target threshold voltage distribution. That is, the system counts the number of memory cells that have, so far, failed to reach their target state. This counting can be done by the state machine, the controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 556, it is determined whether the count from step 554 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 552. In this situation, enough memory cells programmed correctly such that the few remaining memory cells that have not been completely programmed can be corrected using ECC during the read process. In some embodiments, the predetermined limit used in step 556 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 558 and the program counter PC is checked against the program limit value (PL). Examples of program limit values include 5, 12, 16, 19 and 30; however, other values can be used. If the program counter PC is not less than the program limit value PL, then the program process is considered to have failed and a status of FAIL is reported in step 562. If the program counter PC is less than the program limit value PL, then the process continues at step 560 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 560, the process loops back to step 542 and another program pulse is applied to the selected word line so that another iteration (steps 542-560) of the programming process of FIG. 5 is performed.

Figure 6:
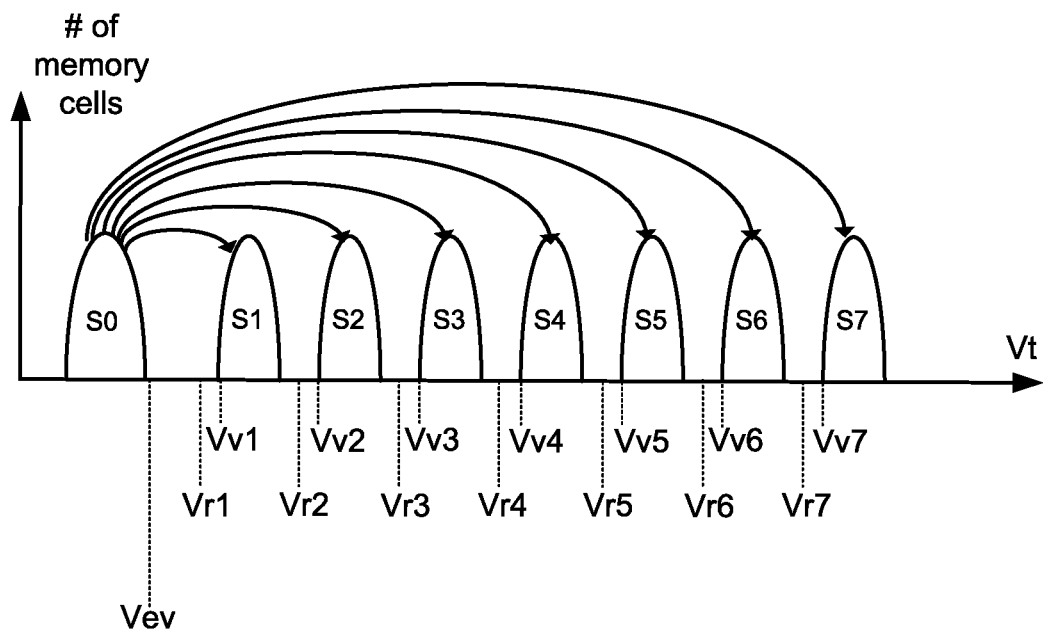
FIG. 6 depicts threshold voltage distributions.

FIG. 6 illustrates example threshold voltage distributions for the memory array when each memory cell stores three bits of data. Other embodiments, however, may use other data capacities per memory cell (e.g., such as one, two, four, or five bits of data per memory cell). Storing more than one bit of data per memory cell is referred to a MLC. Storing one bit of data per memory cell is referred to a SLC. FIG. 6 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 6 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 5 also shows Vev, which is a voltage level to test whether a memory cell has been properly erased.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 102 relying on error correction to identify the correct data being stored.

Although FIG. 6 shows the Vt distributions as non-overlapping, there may be some overlap between adjacent Vt distributions. Over time, effects such as read disturb and data retention may change the shape of the Vt distributions. Read disturb may slightly increase the Vt of a memory cell. Data retention may slightly lower the Vt of a memory cell.

Threshold voltage is one example of a physical property that may be used to store a data state in a memory cell. Resistance is another example of a physical property that may be used to store a data state in a memory cell. In some embodiments, the memory cells are programmed to different resistance states instead of different Vt distributions. For example, phase change memory cells or ReRAM memory cells may be programmed to different resistance states. The memory system applies read reference voltages to the memory cells to distinguish between adjacent resistance states, in some embodiments. In some embodiments, the system dynamically determines a new read reference voltages for distinguishing between two data states associated with two adjacent resistance distributions.

Figure 7:
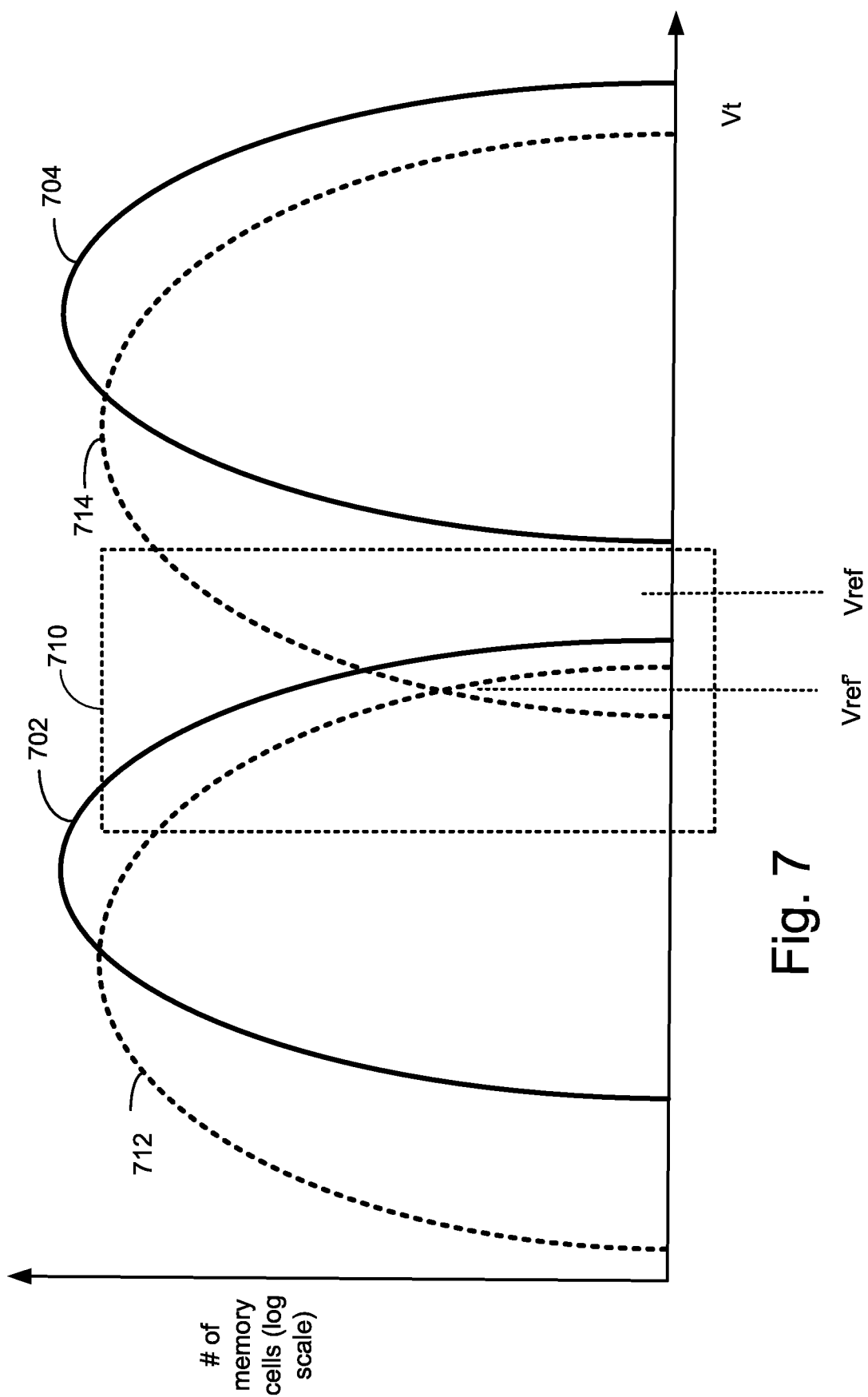
FIG. 7 depicts some Vt distributions to illustrate possible effects of shifts in Vt distributions over time.

FIG. 7 depicts some Vt distributions to illustrate possible effects of shifts in Vt distributions over time. Vt distributions 702 and 704 represent two adjacent Vt distributions just after programming a group of memory cells. These two adjacent Vt distributions could be for any two adjacent data states such as, for example, S0/S1, S1/S2, S2/S3, S3/S4, S4/S5, S5/S6, or S6/S7, in a three bit per memory cell example. The two adjacent Vt distributions 702, 704 could be for cases in which more or fewer than three bits are programmed per memory cell. A read reference voltage (Vref) is depicted between the two adjacent Vt distributions 702, 704. In the three bit per cell example of FIG. 6, Vref might be any of Vr1-Vr7.

Over time each of the Vt distributions 702, 704 may shift somewhat. Vt distribution 712 represents a shifting over time of Vt distribution 702. Vt distribution 714 represents a shifting over time of Vt distribution 704. In this example, each of the Vt distributions 702, 704 has shifted downward (i.e., to lower voltages) somewhat, which may be due to a data retention issue. Note that Vt distributions 702, 704 could potentially have an upward (i.e., to higher voltages) shift due to, for example, read disturb. A dynamic read reference voltage (Vref) is depicted at approximately a valley between the shifted Vt distributions 712, 714. Embodiments disclosed herein determine dynamic read reference voltages such as Vref.

Note that for purpose of discussion, shifted Vt distributions 712, 714 are shown as two distinct Vt distributions. However, memory cells on the portion of Vt distribution 712 that is greater than Vref will initially be indistinguishable from memory cells on the portion of Vt distribution 714 that is less than Vref. Likewise, memory cells on the portion of Vt distribution 712 that is less than Vref will initially be indistinguishable from memory cells on the portion of Vt distribution 714 that is greater than Vref. By initially, it is meant the raw data prior to error correction, which may be referred to as "raw uncorrected data". After error correction, memory cells on the portion of Vt distribution 712 that is greater than Vref' will be properly read as being in the data state associated with Vt distribution 702. Likewise, after error correction, memory cells on the portion of Vt distribution 714 that is less than Vref' will be properly read as being in the data state associated with Vt distribution 704.

The dotted box 710 points out a region in which the two shifted threshold voltage distributions 712, 714 overlap. In one embodiment, the memory system seeks the minimum between the shifted Vt distributions 712, 714. The read reference voltage is revised based on the location of the minimum. For example, the read reference voltage is revised from Vref to Vref. Note that resistance distributions could also shift over time. In some embodiments, the memory system dynamically revises a reference voltage to account for shifts in resistance distributions.

Figure 8A:
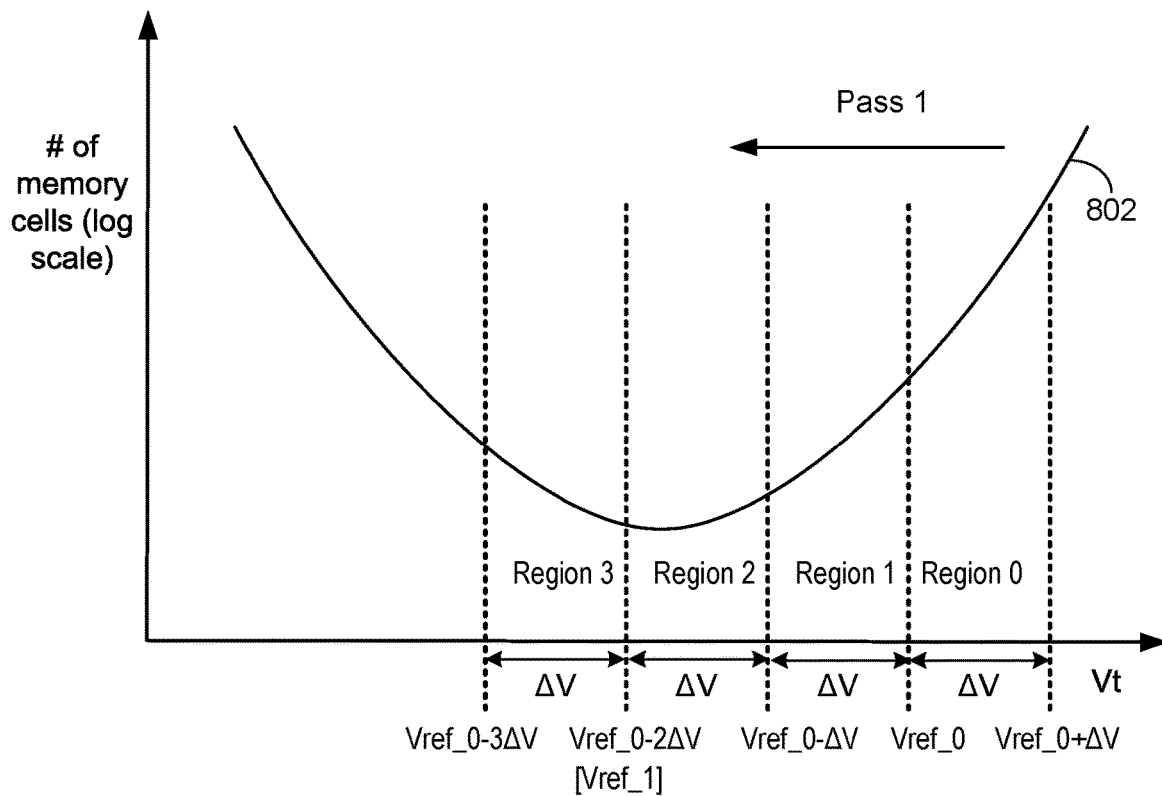
FIGS. 8A-8C illustrate an overview of one embodiment of a multi-pass process to dynamically determine a read reference voltage.
Figure 8B:
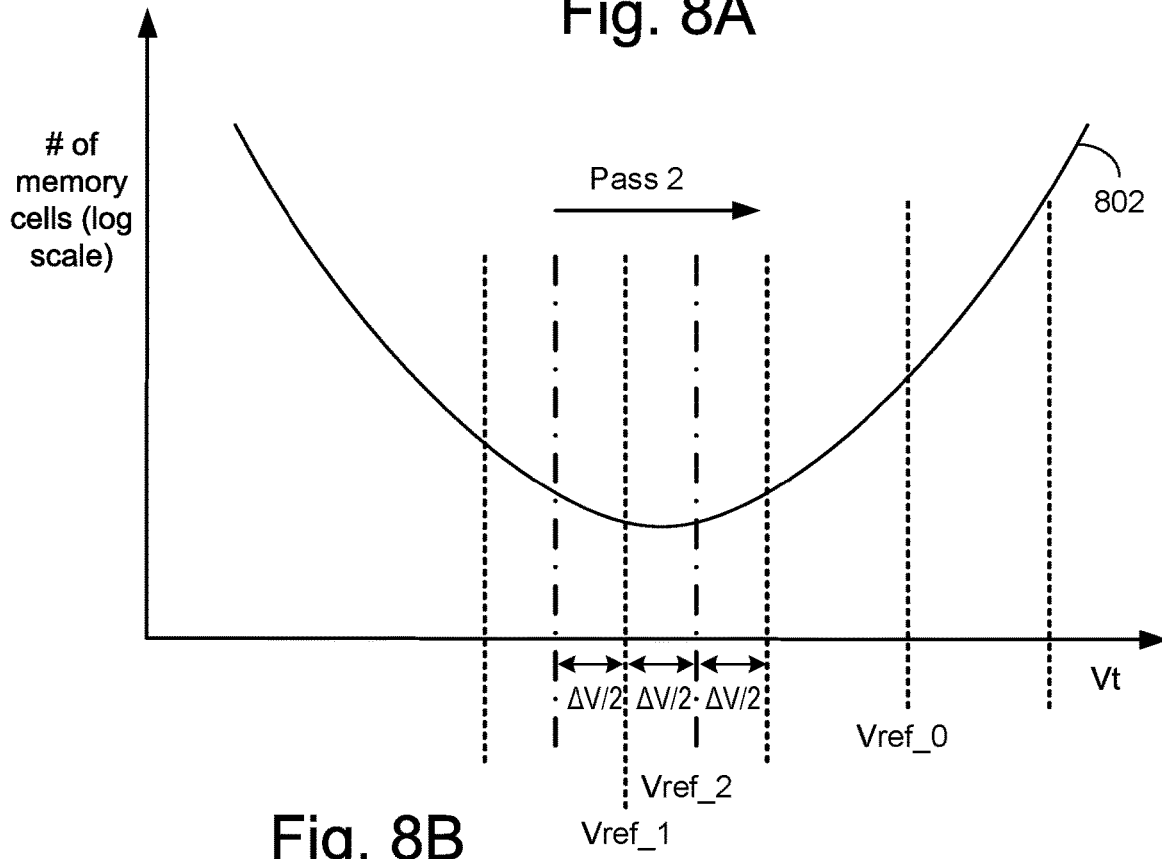
Figure 8C:
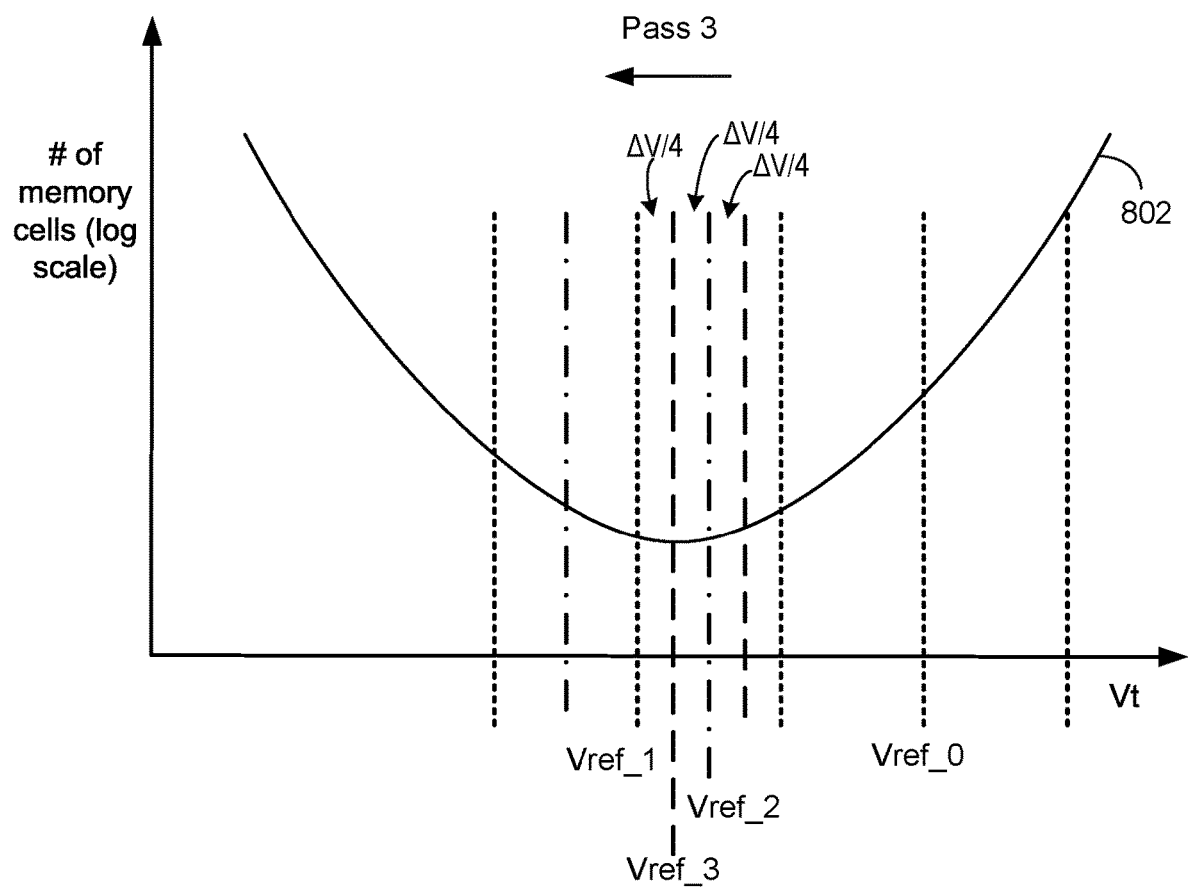

FIGS. 8A-8C will be referred to in order to discuss an overview of one embodiment of a multi-pass process to dynamically determine a read reference voltage. Each of the three Figures shows an overview of one pass of the multi-pass process. With reference to FIG. 8A, curve 802 represents a region in which two Vt distributions overlap. This may correspond to region 710 in FIG. 7. Curve 802 has a different shape than the two shifted Vt distributions 712, 714 because curve 802 represents the Vt of memory cells, without regard to which data state the memory cell was programmed.

The following is a brief overview of the first pass depicted in FIG. 8A. Vref_0 refers to the present read reference voltage being used to distinguish between the two data states. The memory cells are read at reference voltage Vref_0, a reference voltage Vref_0+ΔV, and a reference voltage Vref_0−ΔV. These reference voltages delineate two Vt regions: [Vref−ΔV, Vref], [Vref, Vref+ΔV]. These Vt regions are also referred to as Region 1 and Region 0, respectively. Based on these reads, a determination is made whether there are more memory cells in the region greater than Vref_0 or the region less than Vref_0. The memory cells are then read in a direction of the minimum between the two Vt distributions, which is determined based on which of the two Vt regions has fewer memory cells. In the example of FIG. 8A, the Vt region [Vref−ΔV, Vref] has fewer memory cells, so the next read is performed at Vref−2ΔV. Then, a determination is made whether there are more memory cells in the Vt region [Vref−2ΔV, Vref−ΔV] or [Vref−ΔV, Vref]. In this example, Vt region [Vref−2ΔV, Vref−ΔV] has fewer memory cells. Thus, another read is performed at Vref−3ΔV. Then, a determination is made whether there are more memory cells in the Vt region [Vref−3ΔV, Vref−2ΔV] or [Vref−2Δ, Vref−ΔV]. In this example, Vt region [Vref−2ΔV, Vref−ΔV] has fewer memory cells. This indicates a change in direction, and hence the minimum has been passed. Thus, the Vt region that is most likely to contain the minimum is Vt region [Vref−2ΔV, Vref−ΔV]. In this example, Vref−2ΔV is established as a new read reference voltage Vref_1. This is the estimate of the read reference voltage for distinguishing between the two data states, as of pass 1. In one embodiment, the process could conclude after pass 1.

Note that the term "Vt region" is used herein to refer to a region that is delineated by two reference voltages that are used when the memory cells are programmed to a plurality of Vt distributions. In another embodiment, the memory cells are programmed to a plurality of resistance distributions, and the term "resistance region" is used herein to refer to a region that is delineated by two reference voltages. In general, the term "region" that is delineated by two reference signals (e.g., reference voltages) includes, but is not limited to, a Vt region and a resistance region. In general, the regions pertain to values for a physical property of the memory cell such as Vt, resistance, or conductance.

The following is a brief overview of the second pass depicted in FIG. 8B. The second pass proceeds in a similar manner as the first pass but starts at Vref_1 instead of Vref_0. Also, the size of the regions is cut in half Thus, the memory cells are read at Vref_1−ΔV/2 and Vref_1+ΔV/2. This provides two regions: [Vref_1−ΔV/2, Vref_1] and [Vref_1, Vref_1+ΔV/2]. The number of memory cells in these two regions are compared with each other. In this example, region [Vref_1, Vref_1+ΔV/2] has fewer memory cells. Another comparison is then performed between regions [Vref_1, Vref_1+ΔV/2] and [Vref_1+ΔV/2, Vref_1+ΔV]. In this example, there are more memory cells in region [Vref_1+ΔV], which indicates that the minimum has been passed. Thus, the region that is most likely to contain the minimum is region [Vref_1, Vref_1+ΔV/2]. In this example, Vref_1+ΔV/2 is established as a new read reference voltage (referred to as Vref_2). This is the estimate of the read reference voltage for distinguishing between the two data states, as of pass 2. The process could conclude after pass 2.

For the sake of discussion, a third pass is depicted in FIG. 8C. The third pass proceeds in a similar manner as the pervious two passes but starts at Vref_2. Also, the size of the regions is cut in half from the previous pass. This, the regions now have a size of ΔV/4. Thus, the memory cells are read at Vref_2−ΔV/4 and Vref_2+ΔV/4. This provides two regions: [Vref_2−ΔV/4, Vref_2] and [Vref_2, Vref_2+ΔV/4]. The number of memory cells in these two regions are compared with each other. In this example, region [Vref_2−ΔV/4, Vref_2] has fewer memory cells. Another comparison is then performed between regions [Vref_2−ΔV/2, Vref_2−ΔV/4] and [Vref_2−ΔV/4, Vref_2]. In this example, there are more memory cells in region [Vref_2−ΔV/2, Vref_2−ΔV/4], which indicates that the minimum has been passed. Thus, the region that is most likely to contain the minimum is region [Vref_2−ΔV/4, Vref_2]. In this example, Vref_2−ΔV/4 is established as a new read reference voltage (referred to as Vref_3). This is the estimate of the read reference voltage for distinguishing between the two data states, as of pass 3. The process could conclude after pass 3.

One aspect to note about the multi-pass process is that the use of progressively smaller regions with each pass allows the process to quickly and accurately find the new read reference voltage. If only a single pass were to be performed with smaller regions, two problems could potentially arise. One is that if region sizes are too small, then the comparison of counts of memory cells in two adjacent regions could be inaccurate. For example, with reference to FIG. 8A, with the relatively large size regions near Vref_0, the first pass will correctly determine which region has fewer memory cells. However, there could be a small amount of "noise" in the process, such that curve 802 has irregularities (e.g., is not smooth). If ΔV is made substantially smaller in pass 1, then the system might count more memory cells in the region to the left of Vref_0. Moreover, the process might assume that the minimum occurs in the wrong location. Additionally, more reads are needed if the regions are smaller in the first pass, thereby requiring more time. However, the larger size regions in the first pass do not necessarily find the most optimum read reference level. The one or more additional passes with smaller size regions held to precisely find an optimum read reference level without taking substantial time.

Another aspect to note about the multi-pass process is that data from reads from a previous pass can be used in the present pass, which saves considerable time. For example, in the example pass 2 in FIG. 8B, the comparisons were performed based on reads at two reference voltages in pass 2, and reads at two reference voltages from pass 1. The sensing operations can consume considerable time. Hence, by re-using data from a previous pass, considerable time can be saved.

Figure 9:
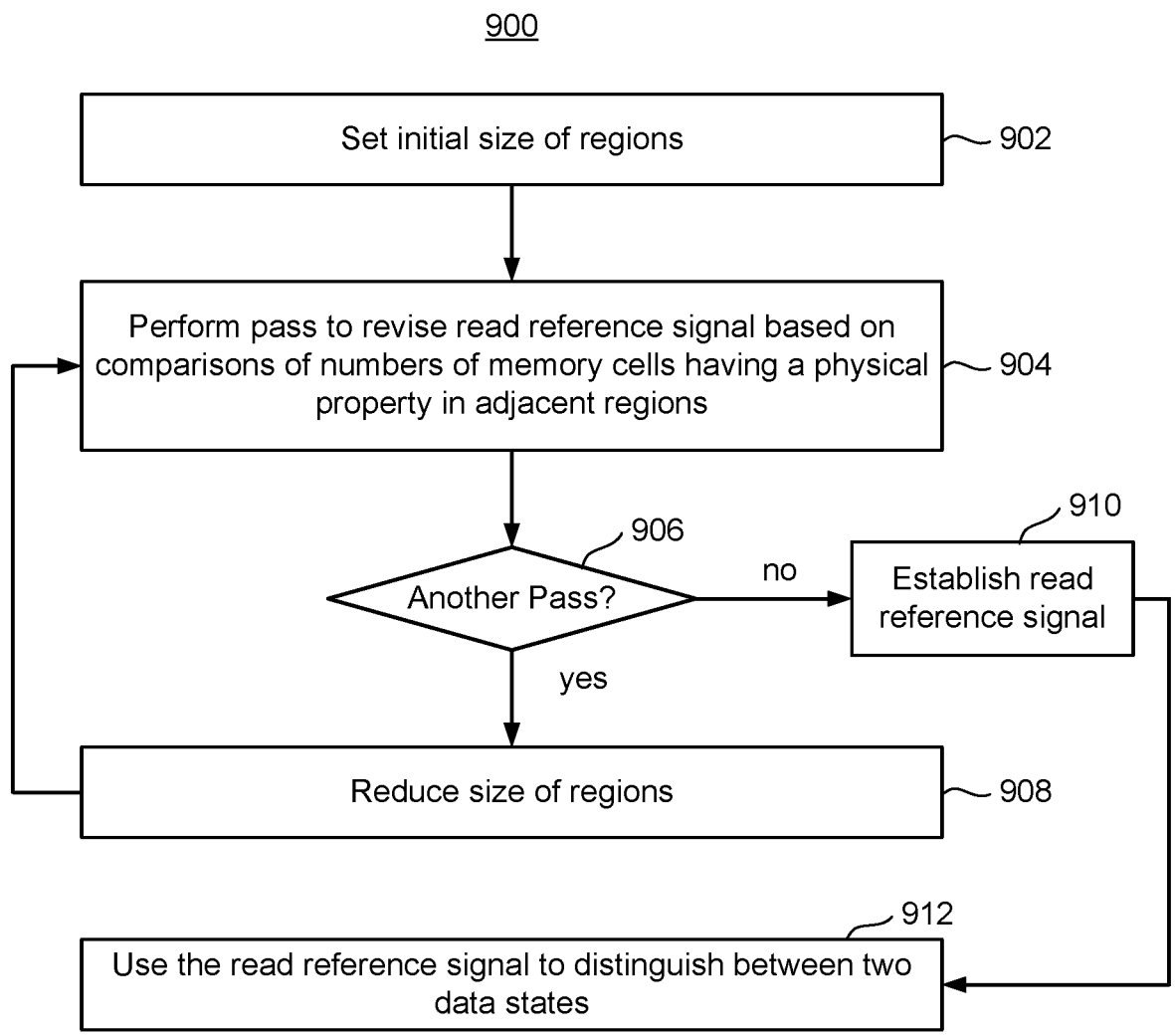
FIG. 9 is a flowchart of one embodiment of a process of determining a new read reference voltage for distinguishing between two data states.

FIG. 9 is a flowchart of one embodiment of a process 900 of determining a new read reference voltage for distinguishing between two data states. In a three bit per cell example, the process might determine a revised value for any of Vr1-Vr7. The process can be used if the memory cells store more or fewer than three bits per cell. The process 900 is used to determine a reference signal (e.g., voltage) for distinguishing between two data states that are associated with adjacent Vt distributions, in one embodiment. Thus, prior to process 900 the memory system programs a group of the memory cells to a plurality of Vt distributions, in one embodiment. In one embodiment, the group of memory cells are connected to the same word line. This might be all of the memory cells connected to the same word line or a subset of the memory cells connected to the same word line. The process 900 is used to determine a reference signal (e.g., voltage) for distinguishing between two data states that are associated with adjacent resistance distributions, in one embodiment. Thus, prior to process 900 the memory system programs a group of the memory cells to a plurality of resistance distributions, in one embodiment.

Step 902 includes setting an initial size of regions used to compare counts of memory cells. With reference to FIG. 8A, the initial size refers to the size of the Vt regions for the first pass. FIG. 8A shows four equal size Vt regions, each have a size of ΔV. An example for the initial size is 100 mV. However, the initial size could be larger or smaller. The regions are resistance regions, in one embodiment. Note that the four equal size Vt regions are delineated by equally spaced reference voltages.

Step 904 includes performing a pass to revise a read reference signal (e.g., read reference voltage, read reference current) that is used to distinguish between two adjacent data states. The reference signal is revised based on comparisons of numbers of memory cells having a value for a physical property (e.g., Vt, resistance, conductance) in adjacent regions, in one embodiment. The physical property may be any physical property that may be used to store a data state including, but not limited to Vt, resistance, and conductance. The reference signal is revised based on comparisons of numbers of memory cells having a Vt in adjacent Vt regions, in one embodiment. The reference signal is revised based on comparisons of numbers of memory cells having a resistance in adjacent resistance regions, in one embodiment. The reference signal is revised based on comparisons of numbers of memory cells having a conductance in adjacent resistance regions, in one embodiment. A determination of which of two adjacent regions has more memory cells is made, in some embodiments. As one example, with reference to FIG. 8A, the following adjacent Vt regions can be examined: (Region 0 and Region 1), (Region 1 and Region 2), (Region 2 and Region 3).

Step 906 is a determination of whether another pass is to be performed. Step 908 is performed if another pass is to be performed. Step 908 includes reducing the size of the regions. In one embodiment, the size of the regions is cut in half. However, the size of the regions could be reduced by a different factor. An example of reducing the size of the regions is the reduction in FIG. 8B, relative to FIG. 8A. For example, the regions can now each have a size of $\Delta V/2$. However, the reduction can be other than cutting the region size in half. Next, step 904 is performed again to revise the read reference signal with the size of the regions reduced.

Step 904 may include performing Pass 2, as depicted in FIG. 8B. When performing pass 2, results from sensing the group in the first pass and results from sensing the group in the second pass are used to revise the read reference signal, in one embodiment. In one embodiment, two adjacent regions are compared in the second pass using results from sensing the group in the first pass at a first reference signal (e.g., Vref1) and results from sensing the group in the second pass at a second reference signal (e.g., Vref_1−$\Delta V/2$) and a third reference signal (e.g., Vref_1+$\Delta V/2$). In this example, the first reference signal is midway between the second reference signal and the third reference signal. In one embodiment, two adjacent regions are compared in the second pass using results from sensing the group in the first pass at two reference signals (e.g., Vref1, Vref1+$\Delta V$) and results from sensing the group in the second pass at a reference signal (e.g., Vref_1+$\Delta V/2$) midway between the two reference signals. In one embodiment, with each pass the adjacent regions are half the size of an immediately previous pass. For example, in pass 1 the regions have a size $\Delta V$, in pass 2 the regions have a size $\Delta V/2$ (and if pass 3 is used, the regions have a size $\Delta V/4$).

If it is determined in step 906 to perform another pass, then step 908 is performed again to further reduce the size of the regions. For example, the region size can be further reduced as depicted in FIG. 8C. When it is determined in step 906 that no more passes are to be performed, then the final read reference signal (e.g., read reference voltage, read reference current) is established in step 910 based on a voltage associated with one of the adjacent regions on a final pass. If the process concluded after Pass 2, then the read reference signal may be established at Vref_2 (see FIG. 8B). If the process concluded after Pass 3, then the read reference signal may be established at Vref_3 (see FIG. 8C).

Step 912 includes using the final read reference signal to sense the memory cells in order to distinguish between two data states. In one embodiment, the final read reference signal is used to distinguish between two data states associated with two Vt distributions. In one embodiment, the final read reference signal is used to distinguish between two data states associated with two resistance distributions.

Figure 10:
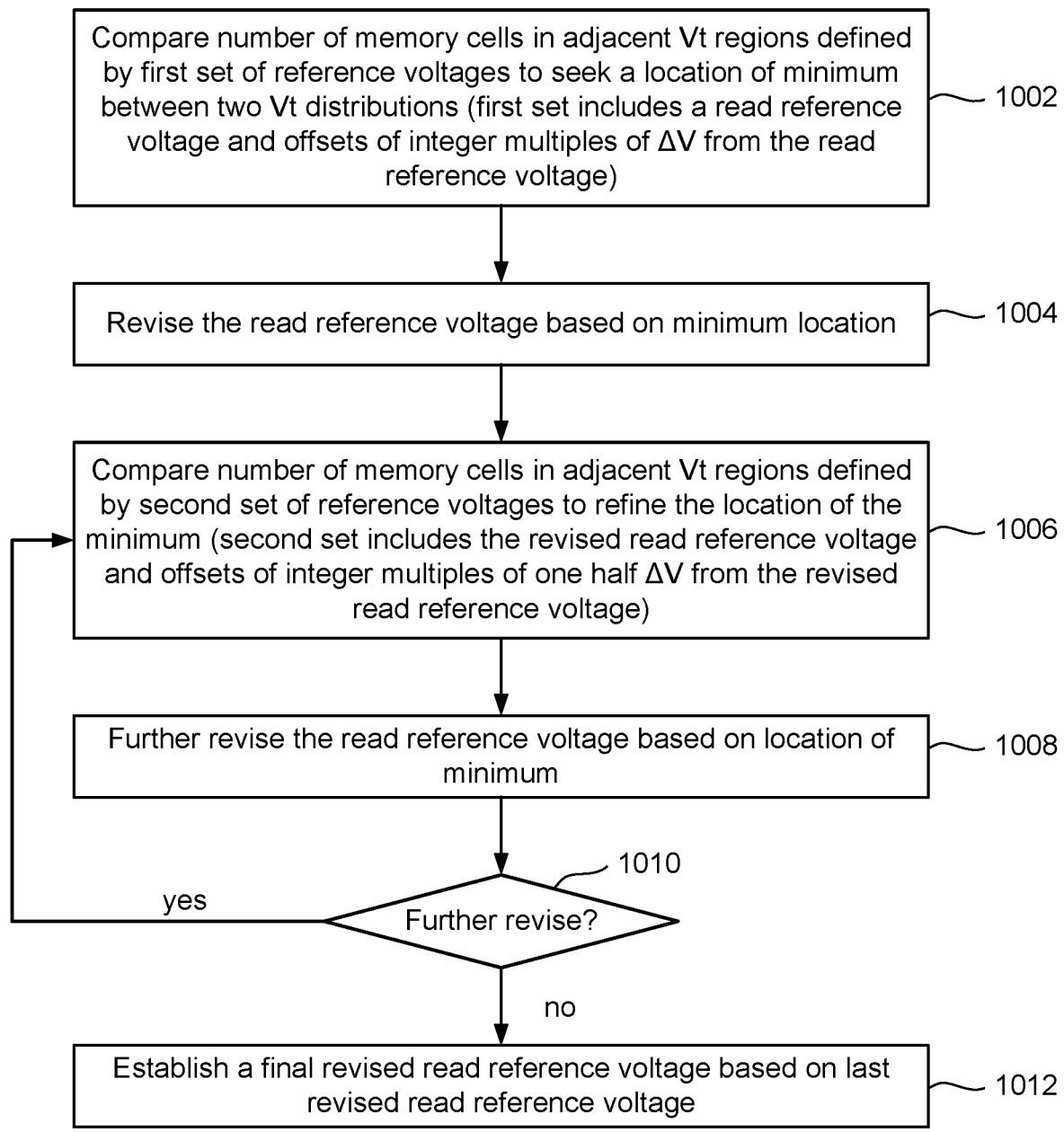
FIG. 10 is a flowchart of one embodiment of a process of determining a new read reference voltage for distinguishing between two data states associated with two Vt distributions.

FIG. 10 is a flowchart of one embodiment of a process 1000 of determining a new read reference voltage for distinguishing between two data states. Process 1000 describes further details of one embodiment of process 900. In process 1000, the two data states are associated with two Vt distributions. Process 1000 may be modified such that the two data states are associated with two resistance distributions.

Step 1002 includes comparing number of memory cells in adjacent Vt regions delineated by a first set of reference voltages to seek a location of minimum between two Vt distributions. The first set of reference voltages include a read reference voltage and offsets of integer multiples of a delta voltage ($\Delta V$) from the read reference voltage. The integer may be positive or negative. The read reference voltage is a present value of a read reference voltage upon entering the process 1000, in one embodiment. In one embodiment, this is a default read reference voltage. The default read reference voltage is the one that is used under the assumption that the memory cells have been freshly programmed in one embodiment. For example, this is one of Vr1-Vr7 (see FIG. 6), in one embodiment. However, the present read reference voltage is not required to be the default. The present read reference voltage may could have been established by previously executing process 1000 (or process 900, or still another process). Thus, by "presently being used" it is meant either the default or the most recent revision to the default. The read reference voltage will be referred to as Vref. An example of step 1002 is to sense the group at the five reference voltages depicted in FIG. 8A. Note that the present value of the read reference voltage in the example of FIG. 8A is Vref_0.

Step 1002 includes determining what voltage levels to sense at based on results of comparing two Vt regions, in one embodiment. For example, after determining that there are fewer memory cells in Region 1 with the number in Region 0, the memory cells are sensed at Vref_0−$2\Delta V$, in one embodiment.

Step 1002 may include continuing to compare adjacent Vt regions until the number of memory cells no longer decreases. For example, with reference to FIG. 8A, a comparison of Region 1 with Region 2 indicates that the number of memory cells is decreasing (in the direction of decreasing Vt). However, a comparison of Region 2 with Region 3 indicates that the number of memory cells is no longer decreasing. Hence, the location of the minimum has been passed.

Step 1004 includes revising the read reference voltage based on the location of the minimum. With reference to FIG. 8A, the read reference voltage is revised from Vref_0 to Vref_1. Steps 1002 and 1004 are performed in one embodiment of a first pass of step 904.

Step 1006 includes comparing a number of memory cells in adjacent Vt regions delineated by a second set of reference voltages to refine a location of the minimum. The second set of reference voltages includes the revised read reference voltage (from step 1004) and offsets of integer multiples of one half the delta voltage from the revised read reference. An example of the second set of reference voltages is Vref_1−$\Delta V/2$, Vref_1, Vref_1+$\Delta V/2$, and Vref_1+$\Delta V$ (see FIG. 8B). Note that step 1006 does not require that sensing again be performed at some of these reference voltages. For example, the data from sensing at Vref_1 and Vref_1+$\Delta V$ may be kept from step 1002. Thus, time can be saved by not having to sense at all of the reference levels.

Step 1006 may include continuing to compare adjacent Vt regions until the number of memory cells no longer decreases. This is similar to what was discussed in step 1002. Note that the direction in which the adjacent Vt regions are compared may be the opposite in the second pass relative to the first pass (see arrows in FIG. 8A, 8B). However, the direction could be the same as in the previous pass. For example, in the FIG. 8B, the number of memory cells in the region [Vref_1−$\Delta V/2$, Vref_1] is greater than the number of memory cells in region [Vref_1, Vref_1+$\Delta V/2$], which results in pass 2 going in the opposite direction as pass 1. However, if the number of memory cells in the region [Vref_1−$\Delta V/2$, Vref_1] is less than the number of memory cells in region [Vref_1, Vref_1+$\Delta V/2$], then pass 2 may proceed in the same direction as pass 1. Thus, the memory system may obtain (or learn) the direction of a pass based on results of comparing two regions in that pass. In one embodiment, one or more control circuits obtain a direction of pass based on the counts of memory cells having a threshold voltage between a pair of the reference voltages that are separated by half the voltage of the immediately previous pass. For example, with reference to FIG. 8B, the direction may be learned by a comparison of counts of memory cells in region [Vref_1−ΔV/2, Vref_1] and region [Vref_1, Vref_1+ΔV/2]. In one embodiment, step 1006 includes obtaining the direction for a pass when refining the location of the minimum during that pass.

Step 1008 includes further revising the read reference voltage based on the location of the minimum in step 1006. With reference to FIG. 8B, the read reference voltage is revised from Vref_1 to Vref_2. Steps 1006 and 1008 are performed in one embodiment of a second pass of step 904.

Step 1010 is a determination of whether to further revise the read reference voltage. In one embodiment, this is based on whether the data from the memory cells can be successfully decoded. In one embodiment, there is a limit to how many times that steps 1006-1008 may be performed. In one embodiment, the read reference voltage is further revised based on sensing the group at a third set of reference voltages that include the revised read reference voltage from the previous iteration of step 1008 and offsets of integer multiples of one quarter the delta voltage from the revised read reference voltage from the previous iteration of step 1008. FIG. 8C depicts one example of how to further revise the read reference voltage. In that example, the read reference voltage is further revised from Vref_2 to Vref_3.

Step 1012 includes establishing the final revised read reference voltage based on the last revised read reference voltage in step 1008. The final revised read reference voltage may then be used to distinguish between two data states. The final revised read reference voltage may be used with other read reference voltages to read data stored in the group. For example, the final revised read reference voltage may be a revised value for Vr7, which may be used with Vr1-Vr6 (which may also be revised by process 1000) in order to read data stored in the group.

Figure 11:
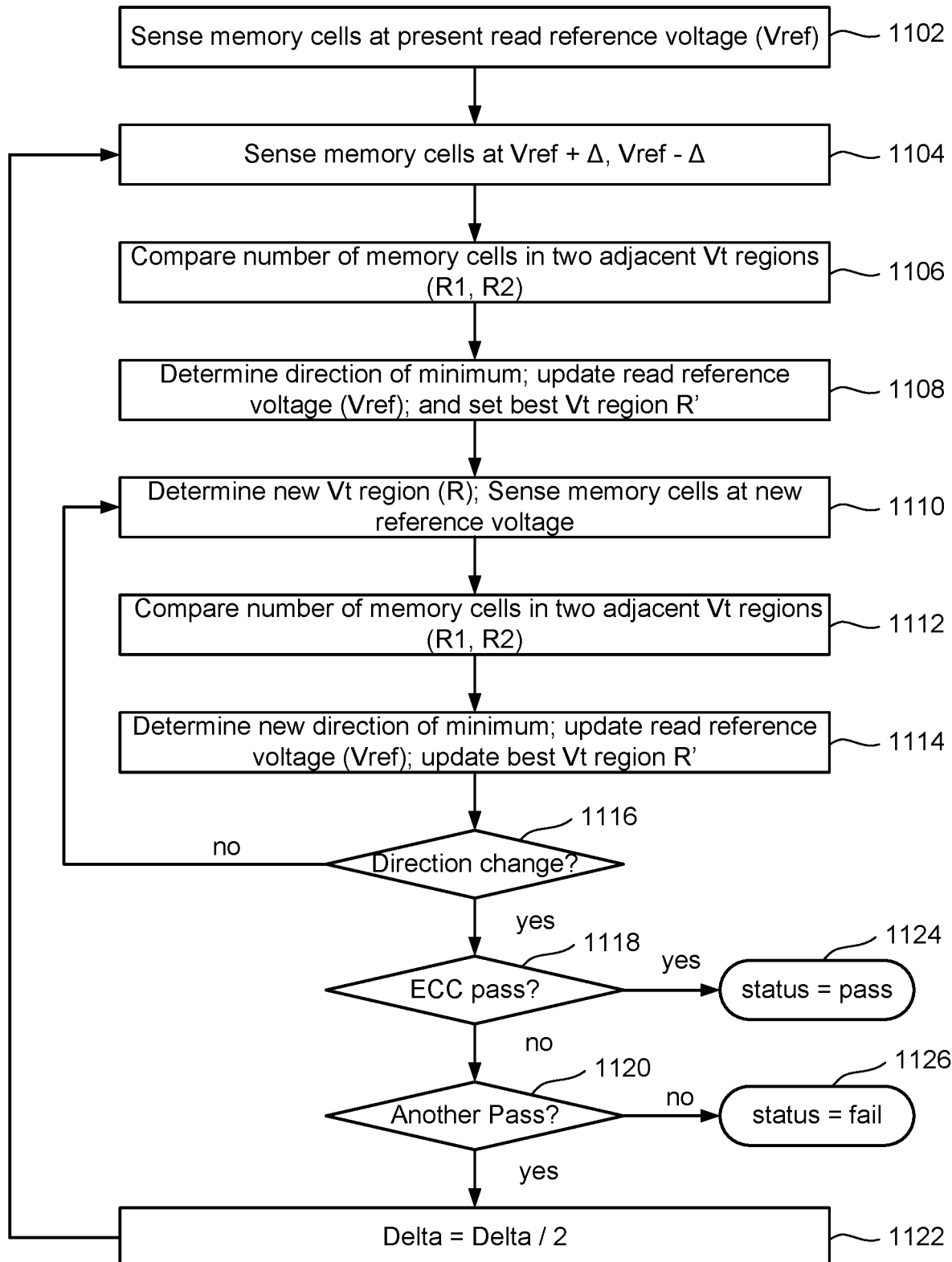
FIG. 11 is a flowchart of one embodiment that provides further details of a process of determining a new read reference voltage for distinguishing between two data states.

FIG. 11 is a flowchart of one embodiment that provides still further details of a process 1100 of determining a new read reference voltage for distinguishing between two data states. Process 1100 describes further details of one embodiment of process 900. Process 1100 describes further details of one embodiment of process 1000. In process 1100, the two data states are associated with two Vt distributions. Process 1100 may be modified such that the two data states are associated with two resistance distributions.

Step 1102 includes sensing memory cells at a present value of a read reference voltage (Vref). In one embodiment, this is a default read reference voltage. The default read reference voltage is the one that is used under the assumption that the memory cells have been freshly programmed in one embodiment. For example, this is one of Vr1-Vr7 (see FIG. 6), in one embodiment. However, the present read reference voltage is not required to be the default. The present read reference voltage may could have been established by previously executing process 1100 (or process 900, process 1000, or still another process). Thus, by "presently being used" it is meant either the default or the most recent revision to the default. The read reference voltage will be referred to as Vref.

Step 1104 includes sensing the memory cells at Vref−ΔV and Vref+ΔV. Note that it is not required that step 1102 be performed prior to sensing at Vref−ΔV or Vref+ΔV. For example, the memory cells could be sensed at Vref−ΔV, then sensed at Vref, and then sensed at Vref+ΔV. The memory cells could be sensed in the opposite order (Vref+ΔV, then sensed at Vref, and then sensed at Vref−ΔV). The memory cells could be sensed in different orders than these examples.

After sensing at each of the reference voltages, a memory cell will either conduct a significant current or not conduct a significant current, in some embodiments. For example, if the Vt of the memory cell is greater than the reference voltage then the memory cell will not conduct a significant current, in some embodiments. If the Vt of the memory cell is less than the reference voltage then the memory cell will conduct a significant current, in some embodiments. Information can be stored in, for example, a sense amplifier to indicate whether the memory cell conducts a significant current in response to a reference voltage. Thus, the system may store information as to the lowest reference voltage (if any) at which the memory cell conducted a significant current.

Step 1106 includes comparing the number of memory cells in two adjacent Vt regions. For purpose of discussion, these two adjacent Vt regions will be referred to as R1, R2. As one example, the number of memory cells in Region 0 and Region 1 (see FIG. 8A) are compared. Thus, initially R1=Region 0 and R2=Region 1. One technique to comparing the number of memory cells in two adjacent Vt regions is to first count memory cells in each Vt region. In one embodiment, the count is determined based on the differences between sensing at two adjacent reference voltages. One technique is to count the number of additional memory cells that conduct a current as with each reference voltage of a greater magnitude. For example, when Vref−ΔV is applied 1000 cells may conduct a current, when Vref is applied 1050 cells may conduct a current, and when Vref+ΔV is applied 1175 cells may conduct a current. This indicates that 50 cells have a Vt in the Vt region [Vref−ΔV, Vref] and 125 cells have a Vt in the Vt region [Vref, Vref+ΔV]. Other techniques may be used to count the cells in each Vt region. Strictly speaking it is not required to determine an actual count of the memory cells in each Vt region. Rather, it is sufficient to know which of the two Vt regions contains more memory cells.

Step 1108 includes a determination of which direction the minimum between the two Vt distributions lies. The direction is determined based on which of the two Vt regions has fewer cells, in one embodiment. As can be seen from the curve 802 in FIG. 8A, the direction the minimum can be determined based on which of the two Vt regions has fewer cells. For example, because Region 1 has fewer cells than Region 0, the minimum lies in the direction of Region 2.

Step 1108 also includes an update of the read reference voltage. The update is based on which Vt region has fewer cells, in one embodiment. The read reference voltage is changed by Δ in the direction of the Vt region having fewer cells, in one embodiment. For example, the read reference voltage is updated to Vref−ΔV if Region 1 has fewer cells than Region 0 (see FIG. 8A).

Step 1108 also includes setting a best Vt region in which to find the minimum. The best Vt region is the Vt region with the fewer cells, in one embodiment. For example, the best Vt region is set to Region 1 (see FIG. 8A).

Step 1110 includes determining a new Vt region to examine. The new Vt region is in the direction of the minimum. For example, the new Vt region is Region 2 (see FIG. 8A). Step 1110 includes setting new Vt regions for the adjacent Vt regions to be compared. Thus, now R1=Region 1, and R2=Region 2 (see FIG. 8A). Step 1110 also includes sensing at another reference voltage to be able to count cells in the new Vt region. For example, the memory cells are sensed at Vref−2ΔV.

Step 1112 includes comparing the number of memory cells in the two adjacent Vt regions. Step 1112 may proceed in a similar manner as step 1106. Step 1114 includes a determination of which direction the minimum lies. In the example of FIG. 8A, Region 2 has fewer cells than Region 1, so the direction is still towards lower voltages. Step 1114 may also include an update to the read reference voltage (Vref). Step 1114 may also include an update to the best Vt region in which to find the minimum.

Step 1116 is a determination of whether the direction has changed. If not, then the process continues at step 1110. If the direction has changed, then the process continues at step 1118. Step 1118 is a determination of whether an ECC test of the memory cells has passed. The ECC test comprises reading the memory cells at the most recent revision to the read reference voltage (Vref in step 1114), and attempting to decode the data using an ECC engine, in one embodiment. In one embodiment, if the data is successfully decoded then the ECC test passes. The ECC engine has more than one decoding algorithm, in some embodiments. For example, there may be a hard ECC decoder and a soft ECC decoder. The hard ECC decoder may be faster at decoding data than the soft ECC decoder, but may fail to be able to successfully decode data that can be successfully decoded with the soft ECC decoder. The ECC check could be based on whether the data can be successfully decoded by the hard ECC decoder for a more stringent test, or whether the data can be successfully decoded by the soft ECC decoder for a less stringent test. If the ECC test passes, the process 1100 ends with a status of pass in step 1124. In some embodiments, the process will skip the ECC test after the first pass, and only perform the ECC test in second and subsequent passes.

If the ECC test fails (or is not performed), then step 1120 is performed. Step 1120 is a determination of whether another pass should be performed. In one embodiment, there is a limit on the number of passes. For example, process 1100 may be limited to two passes, three passes, four passes, etc. If the limit is met, then the process ends with a status of fail in step 1126. If another pass is to be performed, then the delta is cut in half in step 1122. The delta could be reduced by a different factor. The process then returns to step 1104. In this pass, the process may proceed as in, for example, FIG. 8B.

A first embodiment includes an apparatus that includes a group of non-volatile memory cells, and one or more control circuits in communication with the group. The one or more control circuits are configured to perform a plurality of passes to revise a read reference signal based on comparisons of numbers of non-volatile memory cells in the group having a value for a physical property in adjacent regions. With each pass the adjacent regions are smaller. The one or more control circuits are configured to establish a final read reference signal based on a signal associated with one of the adjacent regions on a final pass of the plurality of passes. The one or more control circuits are configured to use the final read reference signal to distinguish between two adjacent data states stored in the group.

In a second embodiment, and in furtherance of the first embodiment, the plurality of passes comprise a first pass and a second pass. The one or more control circuits are further configured to use results from sensing the group in the first pass and results from sensing the group in the second pass to revise the read reference signal in the second pass.

In a third embodiment, and in furtherance of the first of second embodiments, the plurality of passes comprise a first pass and a second pass. The one or more control circuits are further configured to compare two adjacent regions in the second pass using results from sensing the group in the first pass at a first reference signal and results from sensing the group in the second pass at a second reference signal and a third reference signal. The first reference signal is midway between the second reference signal and the third reference signal.

In a fourth embodiment, and in furtherance of any of the first to third embodiments, the plurality of passes comprise a first pass and a second pass. The one or more control circuits are further configured to compare two adjacent regions in the second pass using results from sensing the group in the first pass at two reference signals and results from sensing the group in the second pass at a reference signal midway between the two reference signals.

In a fifth embodiment, and in furtherance of any of the first to fourth embodiments, with each pass the adjacent regions are half the size of an immediately previous pass.

In a sixth embodiment, and in furtherance of any of the first to fifth embodiments, the plurality of passes comprises a first pass. The one or more control circuits are further configured to: sense the group at a present value of the read reference signal, a first reference signal that is a delta greater than the present value of the read reference signal, and a second reference signal that is the delta lower than the present value of the read reference signal; compare a first number of memory cells in a first region between the present value of the read reference signal and the first reference signal with a second number of memory cells in a second region between the present value of the read reference signal and the second reference signal; sense the group at a third reference signal that is the delta lower than second reference signal if the first number is greater than the second number; sense the group at a fourth reference signal that is the delta greater than the first reference signal if the first number is lower than the second number; compare a third number of memory cells in a third region between the third reference signal and the second reference signal with the second number if the first number is greater than the second number; and compare a fourth number of memory cells in a fourth region between the fourth reference signal and the first reference signal with the first number if the first number is lower than the second number.

In a seventh embodiment, and in furtherance of any of the first to sixth embodiments, the physical property is a threshold voltage (Vt). The one or more control circuits are configured to compare numbers of memory cells in the group having a threshold voltage in adjacent Vt regions based on raw data that is not error corrected.

In an eighth embodiment, and in furtherance of any of the first to seventh embodiments, the one or more control circuits are further configured to perform error correction on data sensed from the group prior to establishing the final read reference signal.

In a ninth embodiment, and in furtherance of any of the first to eighth embodiments, the one or more control circuits are further configured to: program the group of non-volatile memory cells to a plurality of threshold voltage distributions, each of the threshold voltage distributions associated with a data state, the two adjacent data states associated with two adjacent threshold voltage distributions; and search for a minimum between the two adjacent threshold voltage distributions to revise the read reference signal.

One embodiment includes a method comprising seeking a location of a minimum between two adjacent threshold voltage (Vt) distributions based on results of sensing a group of non-volatile memory cells at a first set of reference voltages that include a read reference voltage and offsets of integer multiples of a delta voltage from the read reference voltage, including comparing numbers of memory cells in adjacent Vt regions delineated by the first set of reference voltages, the read reference voltage for distinguishing between two data states associated with the two adjacent Vt distributions. The method also includes revising the read reference voltage based on the location of the minimum. The method also includes refining the location of the minimum based on results of sensing the group at a second set of reference voltages that include the revised read reference voltage and offsets of integer multiples of one half the delta voltage from the revised read reference voltage, including comparing numbers of memory cells in adjacent Vt regions delineated by the second set of reference voltages. The method also includes further refining the location of the minimum zero or more additional times. The method also includes establishing a final read reference voltage for distinguishing between the two data states based on the last refined location of the minimum. The method also includes applying the final read reference voltage to the group to distinguish between the two data states.

One embodiment includes a non-volatile storage device, comprising non-volatile memory cells, and one or more control circuits. The one or more control circuits are configured to program a group of the non-volatile memory cells to a plurality of threshold voltage (Vt) distributions comprising two adjacent Vt distributions. The one or more control circuits are configured to perform a first pass to seek a location of a minimum between the two adjacent Vt distributions, including compare counts of memory cells having a Vt between pairs of adjacent reference voltages in a first set of reference voltages that are equally spaced. The one or more control circuits are configured to perform one or more additional passes to refine the location of the minimum, including compare counts of memory cells having a threshold voltage between pairs of reference voltages that are separated by half the voltage of an immediately previous pass. The one or more control circuits are configured to establish a read reference voltage for distinguishing between two data states associated with the two adjacent Vt distributions based on the refined location of the minimum. The one or more control circuits are configured to apply the read reference voltage and other read reference voltages to the group to read data stored in the group.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   one or more control circuits configured to connect to non-volatile memory cells, the one or more control circuits configured to:
   program a group of the non-volatile memory cells to a plurality of data states that are defined by a value of a physical property of the memory cells;
   perform a plurality of passes to revise a read reference signal in which with each pass a range of values of the physical property for a region is smaller, including for a plurality of two adjacent regions determine which region has more memory cells with a value of the physical property within the region, wherein each region is defined by two reference signals that correspond to a range of values of the physical property;
   establish a final read reference signal based on the reference signals for one of the regions on a final pass of the plurality of passes; and
   use the final read reference signal to sense the group to distinguish between two adjacent data states of the plurality of data states.

2. The apparatus of claim 1, wherein the plurality of passes comprise a first pass and a second pass, the one or more control circuits further configured to:
   use results from sensing the group with reference signals in the first pass and results from sensing the group with reference signals in the second pass to revise the read reference signal in the second pass.

3. The apparatus of claim 1, wherein the plurality of passes comprises a first pass and a second pass, the one or more control circuits further configured to:
   compare two adjacent regions in the second pass using results from sensing the group in the first pass with a first reference signal and results from sensing the group in the second pass with a second reference signal and a third reference signal, the first reference signal is midway between the second reference signal and the third reference signal.

4. The apparatus of claim 1, wherein the plurality of passes comprises a first pass and a second pass, the one or more control circuits further configured to:
   compare numbers of memory cells in two adjacent regions in the second pass using results from sensing the group in the first pass with two reference signals and results from sensing the group in the second pass with a reference signal midway between the two reference signals.

5. The apparatus of claim 1, wherein with each pass the range of values of the physical property for the regions is half the range of an immediately previous pass.

6. The apparatus of claim 1, wherein the one or more control circuits are configured to obtain a direction of each of the plurality of passes after a first pass based on counts of memory cells in regions in which the range of values of the physical property is half that of the regions in an immediately previous pass.

7. The apparatus of claim 1, wherein the plurality of passes comprises a first pass, the one or more control circuits further configured to:
sense the group at a present value of the read reference signal, a first reference signal that is a delta greater than the present value of the read reference signal, and a second reference signal that is the delta lower than the present value of the read reference signal;
compare a first number of memory cells in a first region between the present value of the read reference signal and the first reference signal with a second number of memory cells in a second region between the present value of the read reference signal and the second reference signal;
sense the group at a third reference signal that is the delta lower than second reference signal if the first number is greater than the second number;
sense the group at a fourth reference signal that is the delta greater than the first reference signal if the first number is lower than the second number;
compare a third number of memory cells in a third region between the third reference signal and the second reference signal with the second number if the first number is greater than the second number; and
compare a fourth number of memory cells in a fourth region between the fourth reference signal and the first reference signal with the first number if the first number is lower than the second number.

8. The apparatus of claim 1, wherein the physical property is a memory cell threshold voltage (Vt).

9. The apparatus of claim 1, wherein the physical property is a memory cell resistance.

10. The apparatus of claim 1, wherein the one or more control circuits are configured to determine which region has more memory cells having a value of the physical property within the region based on raw data that is not error corrected.

11. The apparatus of claim 10, wherein the one or more control circuits are further configured to perform error correction on data sensed from the group prior to establishing the final read reference signal.

12. The apparatus of claim 1, wherein:
the plurality of data states corresponds to a plurality of threshold voltage distributions of the group of memory cells, the two adjacent data states associated with two adjacent threshold voltage distributions; and
the one or more control circuits are configured to establish the final read reference signal based on a minimum of a number of memory cells having a threshold voltage between the two adjacent threshold voltage distributions.

13. A method comprising:
seeking a value for a read reference voltage based on results of sensing a group of non-volatile memory cells at a first set of reference voltages that include a read reference voltage and offsets of integer multiples of a delta voltage from the read reference voltage, including comparing numbers of memory cells in adjacent Vt regions delineated by the first set of reference voltages, the read reference voltage for distinguishing between two data states associated with two adjacent Vt distributions;
revising the read reference voltage based on the comparison of the numbers of memory cells in adjacent Vt regions;
revising the read reference voltage based on results of sensing the group at a second set of reference voltages that include the revised read reference voltage and offsets of integer multiples of one half the delta voltage from the revised read reference voltage, including comparing numbers of memory cells in adjacent Vt regions delineated by the second set of reference voltages;
further revising the read reference voltage zero or more additional times based on results of sensing the group at a zero or more additional sets of reference voltages that include the revised read reference voltage from the previous set and offsets of integer multiples of one half the delta voltage from the revised read reference voltage from the previous set;
establishing a final read reference voltage for distinguishing between the two data states based on the last revised read reference voltage; and
applying the final read reference voltage to the group to distinguish between the two data states.

14. The method of claim 13, wherein seeking the value for the read reference voltage based on results of sensing the group of non-volatile memory cells at the first set of reference voltages comprises:
comparing numbers of memory cells in adjacent Vt regions delineated by the first set of reference voltages in a first direction until the number of memory cells in a Vt region increases with respect to the adjacent Vt region.

15. A non-volatile storage device, comprising:
read/write circuits configured to connect to non-volatile memory cells; and
a control circuit in communication with the read/write circuits, the control circuit configured to:
program a group of the non-volatile memory cells to a plurality of threshold voltage (Vt) distributions comprising two adjacent Vt distributions;
perform a first pass in which the group is sensed at a first set of equally spaced reference voltages, including determine counts of memory cells having a threshold voltage between adjacent reference voltages in the first set;
perform one or more additional passes in which the group is sensed at a corresponding one or more additional sets of reference voltages that are separated by half the voltage of the set in an immediately previous pass, including determine counts of memory cells having a threshold voltage between adjacent reference voltages in the one or more additional sets;
establish a read reference voltage for distinguishing between two data states associated with the two adjacent Vt distributions based on a reference voltage in a final set of the one or more additional sets of reference voltages; and
apply the read reference voltage and other read reference voltages to the group to read data stored in the group.

16. The non-volatile storage device of claim 15, wherein the control circuit is further configured to:
for a plurality of two adjacent regions defined by three adjacent reference voltages in the first set, determine which region of the two adjacent regions has more memory cells.

17. The non-volatile storage device of claim 15, wherein the control circuit is further configured to obtain a direction of each of the one or more additional passes based on the counts of memory cells having a threshold voltage between pairs of the reference voltages that are separated by half the voltage of the immediately previous pass.

18. The non-volatile storage device of claim 15, wherein the control circuit is further configured to determine counts of memory cells having a threshold voltage between adjacent reference voltages in the first set based on raw uncorrected data sensed from the memory cells.

19. The non-volatile storage device of claim 15, wherein the control circuit is further configured to:
    establish a revised read reference voltage for distinguishing between the two data states based on the first pass; and
    use the revised read reference voltage as a starting point in a second pass of the one or more additional passes to refine the read reference voltage.

20. The non-volatile storage device of claim 19, wherein the control circuit is further configured to:
    sense the memory cells at the revised read reference voltage minus a delta voltage that is half the spacing of the first pass;
    sense the memory cells at the revised read reference voltage plus a delta voltage that is half the spacing of the first pass; and
    compare a number of memory cells in a first Vt region delineated between the revised read reference voltage minus the delta voltage and the revised read reference voltage and a second Vt region delineated between the revised read reference voltage and the revised read reference voltage plus the delta voltage, the control circuit compares using results from sensing the memory cells at the revised read reference voltage in the first pass.

\* \* \* \* \*